United States Patent
Poltorak

(10) Patent No.: US 11,598,593 B2
(45) Date of Patent: Mar. 7, 2023

(54) FRACTAL HEAT TRANSFER DEVICE

(71) Applicant: Fractal Heatsink Technologies LLC, Suffern, NY (US)

(72) Inventor: Alexander Poltorak, Monsey, NY (US)

(73) Assignee: fractal heatsink technologies llc, Miami, FL (US)

( * ) Notice: Subject to any disclaimer, the term of this patent is extended or adjusted under 35 U.S.C. 154(b) by 394 days.

(21) Appl. No.: 16/735,592

(22) Filed: Jan. 6, 2020

(65) Prior Publication Data

US 2020/0149832 A1  May 14, 2020

Related U.S. Application Data

(63) Continuation of application No. 14/817,962, filed on Aug. 4, 2015, now Pat. No. 10,527,368, which is a
(Continued)

(51) Int. Cl.
*F28F 21/02* (2006.01)
*H05K 7/20* (2006.01)
(Continued)

(52) U.S. Cl.
CPC ......... *F28F 21/02* (2013.01); *H05K 7/20509* (2013.01); *F28D 2021/0029* (2013.01);
(Continued)

(58) Field of Classification Search
CPC ...... F28F 21/02; F28F 9/0234; F28F 2210/02; F28F 2215/10; F28F 2255/20;
(Continued)

(56) References Cited

U.S. PATENT DOCUMENTS 2,535,721 A  12/1950 Gaston
3,308,876 A  3/1967 Gram, Jr.
(Continued)

FOREIGN PATENT DOCUMENTS

WO  WO9904429  1/1999
WO  WO2008086479  7/2008

OTHER PUBLICATIONS

Ake Malhammar, A Method for Comparing Heat Sinks Based on Reynolds Analogy, France, Sep. 29-Oct. 2004.
(Continued)

*Primary Examiner* — Joel M Attey
(74) *Attorney, Agent, or Firm* — Hoffberg & Associates; Steven M. Hoffberg

(57) ABSTRACT

A heat sink comprising a heat exchange device having a plurality of heat exchange elements each having a surface boundary with respect to a heat transfer fluid, having a fractal variation therebetween, wherein the heat transfer fluid is induced to flow with respect to the plurality of fractally varying heat exchange elements such that flow-induced vortices are generated at non-corresponding locations of the plurality of fractally varying heat exchange elements, resulting in a reduced resonance as compared to a corresponding heat exchange device having a plurality of heat exchange elements that produce flow-induced vortices at corresponding locations on the plurality of heat exchange elements.

20 Claims, 2 Drawing Sheets

Related U.S. Application Data continuation of application No. 13/106,640, filed on May 12, 2011, now Pat. No. 9,228,785.

(60) Provisional application No. 61/331,103, filed on May 4, 2010.

(51) Int. Cl.

| | |
|---|---|
| F28F 13/12 | (2006.01) |
| F28F 13/06 | (2006.01) |
| F28F 13/02 | (2006.01) |
| H01L 23/467 | (2006.01) |
| F28F 9/02 | (2006.01) |
| F28D 21/00 | (2006.01) |

(52) U.S. Cl.
CPC ............ F28F 9/0234 (2013.01); F28F 13/02 (2013.01); F28F 13/06 (2013.01); F28F 13/12 (2013.01); F28F 2210/02 (2013.01); F28F 2215/10 (2013.01); F28F 2255/20 (2013.01); F28F 2260/00 (2013.01); H01L 23/467 (2013.01)

(58) Field of Classification Search
CPC ........ F28F 2260/00; F28F 13/02; F28F 13/06; F28F 13/12; H05K 7/20509; F28D 2021/0029; H01L 23/467
USPC ........................... 165/185, 80.1, 80.3, 104.33
See application file for complete search history.

(56) References Cited

U.S. PATENT DOCUMENTS

| | | |
|---|---|---|
| 4,463,359 A | 7/1984 | Ayata et al. |
| 4,654,092 A | 3/1987 | Melton |
| 4,660,627 A | 4/1987 | Deck |
| 4,715,438 A | 12/1987 | Gabuzda et al. |
| 4,741,292 A | 5/1988 | Novak |
| 4,769,644 A | 9/1988 | Frazier |
| 4,790,650 A | 12/1988 | Keady |
| 4,819,200 A | 4/1989 | Chua et al. |
| 4,904,073 A | 2/1990 | Lawton et al. |
| 4,931,626 A | 6/1990 | Shikama et al. |
| 5,092,280 A | 3/1992 | Franklin et al. |
| 5,134,685 A | 7/1992 | Rosenbluth |
| 5,169,110 A | 12/1992 | Snaith et al. |
| 5,224,663 A | 7/1993 | Criswell |
| 5,354,017 A | 10/1994 | Levich |
| 5,371,666 A | 12/1994 | Miller |
| 5,371,753 A | 12/1994 | Adsett |
| 5,396,413 A | 3/1995 | Kaneko et al. |
| 5,430,607 A | 7/1995 | Smith |
| 5,443,727 A | 8/1995 | Gagnon |
| 5,453,844 A | 9/1995 | George et al. |
| 5,461,263 A | 10/1995 | Helfrich |
| 5,465,011 A | 11/1995 | Miller et al. |
| 5,471,991 A | 12/1995 | Shinnar |
| 5,483,098 A | 1/1996 | Joiner, Jr. |
| 5,510,598 A | 4/1996 | Kawam et al. |
| 5,548,481 A | 8/1996 | Salisbury et al. |
| 5,549,795 A | 8/1996 | Gregoire et al. |
| 5,566,377 A | 10/1996 | Lee |
| 5,600,073 A | 2/1997 | Hill |
| 5,616,246 A | 4/1997 | Gagnon et al. |
| 5,649,507 A | 7/1997 | Gregoire et al. |
| 5,655,210 A | 8/1997 | Gregoire et al. |
| 5,714,691 A | 2/1998 | Hill |
| 5,720,921 A | 2/1998 | Meserol |
| 5,774,357 A | 6/1998 | Hoffberg et al. |
| 5,781,460 A | 7/1998 | Nguyen et al. |
| 5,792,062 A | 8/1998 | Poon et al. |
| 5,797,736 A | 8/1998 | Menguc et al. |
| 5,803,301 A | 9/1998 | Sato et al. |
| 5,822,721 A | 10/1998 | Johnson et al. |
| 5,834,871 A | 11/1998 | Puskas |
| 5,839,080 A | 11/1998 | Muller et al. |
| 5,841,911 A | 11/1998 | Kopeika et al. |
| 5,842,937 A | 12/1998 | Dalton et al. |
| 5,843,301 A | 12/1998 | Esztergar et al. |
| 5,845,504 A | 12/1998 | LeBleu |
| 5,846,394 A | 12/1998 | Burlatsky et al. |
| 5,856,836 A | 1/1999 | Silverbrook |
| 5,867,386 A | 2/1999 | Hoffberg et al. |
| 5,870,284 A | 2/1999 | Stewart et al. |
| 5,872,443 A | 2/1999 | Williamson |
| 5,875,108 A | 2/1999 | Hoffberg et al. |
| 5,901,246 A | 5/1999 | Hoffberg et al. |
| 5,903,454 A | 5/1999 | Hoffberg et al. |
| 5,920,477 A | 7/1999 | Hoffberg et al. |
| 5,921,679 A | 7/1999 | Muzzio et al. |
| 5,928,726 A | 7/1999 | Butler et al. |
| 5,938,333 A | 8/1999 | Kearney |
| 5,938,594 A | 8/1999 | Poon et al. |
| 5,973,770 A | 10/1999 | Carter et al. |
| 6,002,588 A | 12/1999 | Vos et al. |
| 6,015,008 A | 1/2000 | Kogure et al. |
| 6,048,313 A | 4/2000 | Stonger |
| 6,051,075 A | 4/2000 | Kochergin et al. |
| 6,074,605 A | 6/2000 | Meserol et al. |
| 6,081,750 A | 6/2000 | Hoffberg et al. |
| 6,088,634 A | 7/2000 | Muller et al. |
| 6,090,617 A | 7/2000 | Meserol |
| 6,092,009 A | 7/2000 | Glover |
| 6,122,570 A | 9/2000 | Muller et al. |
| 6,128,188 A | 10/2000 | Hanners |
| 6,138,060 A | 10/2000 | Conner et al. |
| 6,164,458 A | 12/2000 | Mandrin et al. |
| 6,219,592 B1 | 4/2001 | Muller et al. |
| 6,248,399 B1 | 6/2001 | Hehmann |
| 6,259,516 B1 | 7/2001 | Carter et al. |
| 6,276,370 B1 | 8/2001 | Fisch et al. |
| 6,277,522 B1 | 8/2001 | Omaru et al. |
| 6,292,721 B1 | 9/2001 | Conner et al. |
| 6,292,830 B1 | 9/2001 | Taylor et al. |
| 6,310,746 B1 | 10/2001 | Hawwa et al. |
| 6,313,587 B1 | 11/2001 | MacLennan et al. |
| 6,323,432 B1 | 11/2001 | Campbell et al. |
| 6,330,157 B1 | 12/2001 | Bezama et al. |
| 6,330,168 B1 | 12/2001 | Pedoeem et al. |
| 6,333,019 B1 | 12/2001 | Coppens |
| 6,333,852 B1 | 12/2001 | Lin |
| 6,347,263 B1 | 2/2002 | Johnson et al. |
| 6,356,444 B1 | 3/2002 | Pedoeem |
| 6,359,565 B1 | 3/2002 | Pedoeem et al. |
| 6,382,208 B2 | 5/2002 | Reedy et al. |
| 6,390,475 B1 | 5/2002 | Eckblad et al. |
| 6,398,736 B1 | 6/2002 | Seward |
| 6,400,996 B1 | 6/2002 | Hoffberg et al. |
| 6,418,424 B1 | 7/2002 | Hoffberg et al. |
| 6,422,998 B1 | 7/2002 | Vo-Dinh et al. |
| 6,424,099 B1 | 7/2002 | Kirkpatrick et al. |
| 6,433,749 B1 | 8/2002 | Thompson |
| 6,484,132 B1 | 11/2002 | Hively et al. |
| 6,485,961 B1 | 11/2002 | Meserol |
| 6,487,442 B1 | 11/2002 | Wood |
| 6,502,067 B1 | 12/2002 | Hegger et al. |
| 6,512,996 B1 | 1/2003 | Praskovsky et al. |
| 6,544,187 B2 | 4/2003 | Seward |
| 6,544,309 B1 | 4/2003 | Hoefer et al. |
| 6,566,646 B1 | 5/2003 | Iwakawa |
| 6,570,078 B2 | 5/2003 | Ludwig |
| 6,581,008 B2 | 6/2003 | Intriligator et al. |
| 6,592,822 B1 | 7/2003 | Chandler |
| 6,597,906 B1 | 7/2003 | Van Leeuwen et al. |
| 6,606,034 B1 | 8/2003 | Muller et al. |
| 6,608,716 B1 | 8/2003 | Armstrong et al. |
| 6,610,917 B2 | 8/2003 | Ludwig |
| 6,616,327 B1 | 9/2003 | Kearney et al. |
| 6,617,154 B1 | 9/2003 | Meserol |
| 6,628,132 B2 | 9/2003 | Pfahnl et al. |
| 6,640,145 B2 | 10/2003 | Hoffberg et al. |
| 6,641,471 B1 | 11/2003 | Pinheiro et al. |
| 6,641,796 B2 | 11/2003 | Micco et al. |

(56) References Cited

U.S. PATENT DOCUMENTS

| | | |
|---|---|---|
| 6,679,272 B2 | 1/2004 | Bran et al. |
| 6,681,589 B2 | 1/2004 | Brudnicki |
| 6,688,381 B2 | 2/2004 | Pence et al. |
| 6,689,486 B2 | 2/2004 | Ho et al. |
| 6,689,947 B2 | 2/2004 | Ludwig |
| 6,691,004 B2 | 2/2004 | Johnson et al. |
| 6,707,837 B1 | 3/2004 | Muller |
| 6,710,723 B2 | 3/2004 | Muller et al. |
| 6,716,557 B2 | 4/2004 | Omaru et al. |
| 6,717,661 B1 | 4/2004 | Bernstein et al. |
| 6,721,572 B1 | 4/2004 | Smith et al. |
| 6,727,820 B2 | 4/2004 | Pedoeem et al. |
| 6,736,195 B2 | 5/2004 | Busch et al. |
| 6,742,924 B2 | 6/2004 | Kearney |
| 6,751,027 B2 | 6/2004 | Van Den Bossche et al. |
| 6,773,669 B1 | 8/2004 | Holaday et al. |
| 6,781,690 B2 | 8/2004 | Armstrong et al. |
| 6,816,786 B2 | 11/2004 | Intriligator et al. |
| 6,849,795 B2 | 2/2005 | Ludwig |
| 6,850,252 B1 | 2/2005 | Hoffberg |
| 6,852,919 B2 | 2/2005 | Ludwig |
| 6,865,083 B2 | 3/2005 | Liu |
| 6,876,304 B2 | 4/2005 | Pedoeem et al. |
| 6,876,320 B2 | 4/2005 | Puente Baliarda |
| 6,895,375 B2 | 5/2005 | Malah et al. |
| 6,898,216 B1 | 5/2005 | Kleinschmidt |
| 6,905,595 B2 | 6/2005 | Gebauer |
| 6,906,296 B2 | 6/2005 | Centanni et al. |
| 6,909,198 B2 | 6/2005 | Ragwitz et al. |
| 6,937,473 B2 | 8/2005 | Cheng et al. |
| 6,941,973 B2 | 9/2005 | Hehmann |
| 6,942,767 B1 | 9/2005 | Fazzina et al. |
| 6,945,094 B2 | 9/2005 | Eggen et al. |
| 6,949,887 B2 | 9/2005 | Kirkpatrick et al. |
| 6,967,315 B2 | 11/2005 | Centanni et al. |
| 6,969,327 B2 | 11/2005 | Aoyama et al. |
| 6,971,383 B2 | 12/2005 | Hickey et al. |
| 6,972,972 B2 | 12/2005 | Duncan et al. |
| 6,980,092 B2 | 12/2005 | Turnbull et al. |
| 6,986,739 B2 | 1/2006 | Warren et al. |
| 6,988,066 B2 | 1/2006 | Malah |
| 6,993,377 B2 | 1/2006 | Flick et al. |
| 6,994,045 B2 | 2/2006 | Paszkowski |
| 7,001,521 B2 | 2/2006 | Paananen et al. |
| 7,006,881 B1 | 2/2006 | Hoffberg et al. |
| 7,010,991 B2 | 3/2006 | Lutz et al. |
| 7,018,418 B2 | 3/2006 | Amrich et al. |
| 7,038,123 B2 | 5/2006 | Ludwig |
| 7,050,605 B2 | 5/2006 | Gerson et al. |
| 7,055,262 B2 | 6/2006 | Goldberg et al. |
| 7,080,989 B2 | 7/2006 | Gates |
| 7,096,121 B2 | 8/2006 | Intriligator et al. |
| 7,103,480 B2 | 9/2006 | Intriligator et al. |
| 7,113,402 B2 | 9/2006 | Rutledge et al. |
| 7,117,108 B2 | 10/2006 | Rapp et al. |
| 7,117,131 B2 | 10/2006 | Binnig |
| 7,123,359 B2 | 10/2006 | Armstrong et al. |
| 7,128,833 B2 | 10/2006 | Jumppanen et al. |
| 7,129,091 B2 | 10/2006 | Ismagilov et al. |
| 7,136,710 B1 | 11/2006 | Hoffberg et al. |
| 7,177,282 B1 | 2/2007 | Gilbert et al. |
| 7,178,941 B2 | 2/2007 | Roberge et al. |
| 7,190,579 B2 | 3/2007 | Chao |
| 7,195,058 B2 | 3/2007 | Wolford et al. |
| 7,204,832 B2 | 4/2007 | Altshuler et al. |
| 7,216,074 B2 | 5/2007 | Malah et al. |
| 7,217,878 B2 | 5/2007 | Ludwig |
| 7,226,539 B2 | 6/2007 | Dong et al. |
| 7,238,085 B2 | 7/2007 | Montierth et al. |
| 7,242,988 B1 | 7/2007 | Hoffberg et al. |
| 7,256,751 B2 | 8/2007 | Cohen |
| 7,258,632 B2 | 8/2007 | Aoyama et al. |
| 7,260,299 B1 | 8/2007 | Di Teodoro et al. |
| 7,263,130 B1 | 8/2007 | Mitlin |
| 7,265,826 B2 | 9/2007 | Mottin |
| 7,267,798 B2 | 9/2007 | Chandler |
| 7,271,952 B2 | 9/2007 | Suzuki et al. |
| 7,272,599 B1 | 9/2007 | Gilbert et al. |
| 7,273,456 B2 | 9/2007 | May et al. |
| 7,276,026 B2 | 10/2007 | Skinner |
| 7,296,014 B1 | 11/2007 | Gilbert et al. |
| 7,303,491 B2 | 12/2007 | Nardacci et al. |
| 7,303,682 B2 | 12/2007 | Paananen et al. |
| 7,309,828 B2 | 12/2007 | Ludwig |
| 7,309,829 B1 | 12/2007 | Ludwig |
| 7,327,123 B2 | 2/2008 | Faberman et al. |
| 7,327,226 B2 | 2/2008 | Turnbull et al. |
| 7,351,360 B2 | 4/2008 | Hougham et al. |
| 7,375,877 B1 | 5/2008 | Di Teodoro et al. |
| 7,376,553 B2 | 5/2008 | Quinn |
| 7,379,237 B1 | 5/2008 | Di Teodoro et al. |
| 7,379,648 B1 | 5/2008 | Brooks et al. |
| 7,383,607 B2 | 6/2008 | Johnson |
| 7,386,211 B1 | 6/2008 | Di Teodoro et al. |
| 7,390,408 B2 | 6/2008 | Kearney et al. |
| 7,391,561 B2 | 6/2008 | Di Teodoro et al. |
| 7,400,804 B1 | 7/2008 | Di Teodoro et al. |
| 7,407,586 B2 | 8/2008 | Jumppanen et al. |
| 7,408,108 B2 | 8/2008 | Ludwig |
| 7,411,791 B2 | 8/2008 | Chang et al. |
| 7,416,903 B2 | 8/2008 | Sklar et al. |
| 7,417,954 B1 | 8/2008 | Gilbert et al. |
| 7,422,910 B2 | 9/2008 | Fitzgerald et al. |
| 7,430,352 B2 | 9/2008 | Di Teodoro et al. |
| 7,436,585 B1 | 10/2008 | Di Teodoro et al. |
| 7,440,175 B2 | 10/2008 | Di Teodoro et al. |
| 7,442,360 B2 | 10/2008 | Tonkovich et al. |
| 7,451,005 B2 | 11/2008 | Hoffberg et al. |
| 7,485,343 B1 | 2/2009 | Branson et al. |
| 7,495,671 B2 | 2/2009 | Chemel et al. |
| 7,496,000 B2 | 2/2009 | Vosburgh et al. |
| 7,502,034 B2 | 3/2009 | Chemel et al. |
| 7,507,380 B2 | 3/2009 | Chang et al. |
| 7,507,902 B2 | 3/2009 | Ludwig |
| 7,513,839 B2 | 4/2009 | Nardacci et al. |
| 7,539,533 B2 | 5/2009 | Tran |
| 7,551,519 B2 | 6/2009 | Slater |
| 7,554,511 B2 | 6/2009 | Fager et al. |
| 7,558,622 B2 | 7/2009 | Tran |
| 7,569,354 B2 | 8/2009 | Okano et al. |
| 7,588,505 B2 | 9/2009 | Hebert et al. |
| 7,589,742 B2 | 9/2009 | Street et al. |
| 7,590,589 B2 | 9/2009 | Hoffberg |
| 7,593,789 B2 | 9/2009 | Gougerot et al. |
| 7,604,956 B2 | 10/2009 | Drukier |
| 7,613,604 B1 | 11/2009 | Malah et al. |
| 7,614,406 B2 | 11/2009 | Bran |
| 7,630,931 B1 | 12/2009 | Rachev et al. |
| 7,638,704 B2 | 12/2009 | Ludwig |
| 7,641,865 B2 | 1/2010 | Tonkovich et al. |
| 7,643,295 B2 | 1/2010 | Chao et al. |
| 7,646,029 B2 | 1/2010 | Mueller et al. |
| 7,646,607 B2 | 1/2010 | Gallina et al. |
| 7,650,319 B2 | 1/2010 | Hoffberg et al. |
| 7,652,208 B1 | 1/2010 | Ludwig |
| 7,655,341 B2 | 2/2010 | Strobel et al. |
| 7,665,225 B2 | 2/2010 | Goldberg et al. |
| 7,689,283 B1 | 3/2010 | Schecter |
| 7,696,890 B2 | 4/2010 | Bandholz et al. |
| 7,710,424 B1 | 5/2010 | Hutchins et al. |
| 7,724,258 B2 | 5/2010 | Ebert et al. |
| 7,727,746 B2 | 6/2010 | Foody et al. |
| 7,728,837 B2 | 6/2010 | Szymanski et al. |
| 7,733,224 B2 | 6/2010 | Tran |
| 7,740,026 B2 | 6/2010 | Matsui et al. |
| 7,744,855 B2 | 6/2010 | Staniforth et al. |
| 7,751,118 B2 | 7/2010 | Di Teodoro et al. |
| 7,757,866 B2 | 7/2010 | McCutchen |
| 7,759,571 B2 | 7/2010 | Ludwig |
| 7,767,902 B2 | 8/2010 | Ludwig |
| 7,769,782 B1 | 8/2010 | Gilbert et al. |
| 7,772,966 B2 | 8/2010 | Turnbull et al. |
| 7,778,029 B2 | 8/2010 | Ueno |
| 7,782,459 B2 | 8/2010 | Holve |

(56) References Cited

U.S. PATENT DOCUMENTS

| | | | |
|---|---|---|---|
| 7,782,527 B1 | 8/2010 | Brooks et al. | |
| 7,786,370 B2 | 8/2010 | Ludwig | |
| 7,796,383 B2 | 9/2010 | Kavanagh | |
| 7,799,557 B2 | 9/2010 | Oh et al. | |
| 7,804,186 B2 | 9/2010 | Freda | |
| 7,805,832 B2 | 10/2010 | Burke et al. | |
| 7,813,822 B1 | 10/2010 | Hoffberg | |
| 7,814,965 B1 * | 10/2010 | Spokoiny | H01L 23/467 165/80.4 |
| 7,830,596 B1 | 11/2010 | Di Teodoro et al. | |
| 7,835,068 B1 | 11/2010 | Brooks et al. | |
| 7,848,106 B2 | 12/2010 | Merrow | |
| 7,850,862 B2 | 12/2010 | Amrich et al. | |
| 7,852,628 B2 | 12/2010 | Hirohata et al. | |
| 7,856,154 B2 | 12/2010 | Young | |
| 7,857,756 B2 | 12/2010 | Warren et al. | |
| 7,866,822 B2 | 1/2011 | Yokoyama et al. | |
| 7,871,578 B2 | 1/2011 | Schmidt | |
| 7,877,876 B2 | 2/2011 | Burke et al. | |
| 7,891,818 B2 | 2/2011 | Christensen et al. | |
| 7,901,939 B2 | 3/2011 | Ismagliov et al. | |
| 7,904,187 B2 | 3/2011 | Hoffberg et al. | |
| 7,904,211 B2 | 3/2011 | Merrow et al. | |
| 7,938,543 B2 | 5/2011 | Gerets et al. | |
| 7,941,019 B1 | 5/2011 | Brooks et al. | |
| 7,955,504 B1 | 6/2011 | Jovanovic et al. | |
| 7,959,880 B2 | 6/2011 | Tonkovich et al. | |
| 7,960,640 B2 | 6/2011 | Ludwig | |
| 7,965,643 B1 | 6/2011 | Gilbert et al. | |
| 7,966,078 B2 | 6/2011 | Hoffberg et al. | |
| 7,968,789 B2 | 6/2011 | Stoner et al. | |
| 7,974,714 B2 | 7/2011 | Hoffberg | |
| 7,979,979 B2 | 7/2011 | Burke et al. | |
| 7,987,003 B2 | 7/2011 | Hoffberg et al. | |
| 7,987,677 B2 | 8/2011 | McCutchen | |
| 8,003,370 B2 | 8/2011 | Maltezos et al. | |
| 8,008,046 B2 | 8/2011 | Maltezos et al. | |
| 8,014,150 B2 | 9/2011 | Campbell et al. | |
| 8,025,801 B2 | 9/2011 | McCutchen | |
| 8,030,565 B2 | 10/2011 | Ludwig | |
| 8,030,566 B2 | 10/2011 | Ludwig | |
| 8,030,567 B2 | 10/2011 | Ludwig | |
| 8,030,818 B2 | 10/2011 | Nelson et al. | |
| 8,031,060 B2 | 10/2011 | Hoffberg et al. | |
| 8,032,477 B1 | 10/2011 | Hoffberg et al. | |
| 8,033,933 B2 | 10/2011 | Sullivan et al. | |
| 8,035,024 B2 | 10/2011 | Ludwig | |
| 8,037,927 B2 | 10/2011 | Schuette | |
| 8,040,508 B2 | 10/2011 | Holve | |
| 8,046,313 B2 | 10/2011 | Hoffberg et al. | |
| 8,055,392 B2 | 11/2011 | Kitamura et al. | |
| 8,069,038 B2 | 11/2011 | Malah et al. | |
| 8,080,819 B2 | 12/2011 | Mueller et al. | |
| 8,081,479 B2 | 12/2011 | Tanaka | |
| 8,089,173 B2 | 1/2012 | Freda | |
| 8,092,625 B2 | 1/2012 | Burke et al. | |
| 8,093,772 B2 | 1/2012 | Scott et al. | |
| 8,100,205 B2 | 1/2012 | Gettings et al. | |
| 8,101,160 B2 | 1/2012 | Staniforth et al. | |
| 8,102,173 B2 | 1/2012 | Merrow | |
| 8,103,333 B2 | 1/2012 | Tran | |
| 8,108,036 B2 | 1/2012 | Tran | |
| 8,110,103 B2 | 2/2012 | Mormino et al. | |
| 8,111,261 B1 | 2/2012 | Perlin | |
| 8,114,438 B2 | 2/2012 | Pipkin et al. | |
| 8,116,024 B2 | 2/2012 | Erden | |
| 8,116,841 B2 | 2/2012 | Bly et al. | |
| 8,117,480 B2 | 2/2012 | Merrow et al. | |
| 8,137,216 B2 | 3/2012 | Sullivan et al. | |
| 8,137,554 B2 | 3/2012 | Jovanovic et al. | |
| 8,137,626 B2 | 3/2012 | Maltezos et al. | |
| 8,157,032 B2 | 4/2012 | Gettings | |
| 8,165,916 B2 | 4/2012 | Hoffberg et al. | |
| 8,167,826 B2 | 5/2012 | Oohashi et al. | |
| 8,178,990 B2 | 5/2012 | Freda | |
| 8,182,473 B2 | 5/2012 | Altshuler et al. | |
| 8,182,573 B2 | 5/2012 | Stark et al. | |
| 8,187,541 B2 | 5/2012 | Maltezos et al. | |
| 8,203,840 B2 | 6/2012 | Lin et al. | |
| 8,207,821 B2 | 6/2012 | Roberge et al. | |
| 8,208,698 B2 | 6/2012 | Bogdan | |
| 8,210,171 B2 | 7/2012 | Denny et al. | |
| 8,223,062 B2 | 7/2012 | Bunch et al. | |
| 8,228,671 B2 | 7/2012 | Ikeda | |
| 8,232,091 B2 | 7/2012 | Maltezos et al. | |
| 8,238,099 B2 | 8/2012 | Merrow | |
| 8,249,686 B2 | 8/2012 | Libbus et al. | |
| 8,258,206 B2 | 9/2012 | Kanagasabapathy et al. | |
| 8,262,909 B2 | 9/2012 | Angelescu et al. | |
| 8,268,136 B2 | 9/2012 | McCutchen et al. | |
| 8,273,245 B2 | 9/2012 | Jovanovic et al. | |
| 8,273,330 B2 | 9/2012 | York et al. | |
| 8,273,573 B2 | 9/2012 | Ismagilov et al. | |
| 8,279,597 B2 | 10/2012 | El-Essawy et al. | |
| 8,280,641 B1 | 10/2012 | Pellionisz | |
| 8,285,356 B2 | 10/2012 | Bly et al. | |
| 8,289,710 B2 | 10/2012 | Spearing et al. | |
| 8,295,046 B2 | 10/2012 | St. Rock et al. | |
| 8,295,049 B2 | 10/2012 | West | |
| 8,296,937 B2 | 10/2012 | Burke et al. | |
| 8,304,193 B2 | 11/2012 | Ismagilov et al. | |
| 8,323,188 B2 | 12/2012 | Tran | |
| 8,329,407 B2 | 12/2012 | Ismagilov et al. | |
| 8,352,400 B2 | 1/2013 | Hoffberg et al. | |
| 8,361,622 B2 | 1/2013 | Gottschalk-Gaudig et al. | |
| 8,363,392 B2 | 1/2013 | Tanaka | |
| 8,364,136 B2 | 1/2013 | Hoffberg et al. | |
| 8,369,967 B2 | 2/2013 | Hoffberg et al. | |
| 8,371,291 B2 | 2/2013 | Haroutunian | |
| 8,374,688 B2 | 2/2013 | Libbus et al. | |
| 8,385,066 B2 | 2/2013 | Chang et al. | |
| 8,388,401 B2 | 3/2013 | Lanahan | |
| 8,395,276 B2 | 3/2013 | Freda | |
| 8,395,629 B1 | 3/2013 | Kilpatrick et al. | |
| 8,396,700 B2 | 3/2013 | Chakrabarty et al. | |
| 8,397,842 B2 | 3/2013 | Gettings | |
| 8,400,766 B2 | 3/2013 | Kim | |
| 8,402,490 B2 | 3/2013 | Hoffberg-Borghesani et al. | |
| 8,409,807 B2 | 4/2013 | Neely et al. | |
| 8,412,317 B2 | 4/2013 | Mazar | |
| 8,414,182 B2 | 4/2013 | Paul et al. | |
| 8,416,297 B2 | 4/2013 | Finn et al. | |
| 8,434,575 B2 | 5/2013 | Gettings et al. | |
| 8,441,154 B2 | 5/2013 | Karalis et al. | |
| 8,449,471 B2 | 5/2013 | Tran | |
| 8,451,608 B2 | 5/2013 | Merrow | |
| 8,460,126 B2 | 6/2013 | Sullivan et al. | |
| 8,460,189 B2 | 6/2013 | Libbus et al. | |
| 8,466,583 B2 | 6/2013 | Karalis et al. | |
| 8,472,763 B1 | 6/2013 | Liu et al. | |
| 8,474,264 B2 | 7/2013 | McCutchen | |
| 8,475,616 B2 | 7/2013 | McCutchen | |
| 8,482,146 B2 | 7/2013 | Freda | |
| 8,482,915 B2 | 7/2013 | Merrow | |
| 8,484,000 B2 | 7/2013 | Gulati | |
| 8,491,683 B1 | 7/2013 | Brown-Fitzpatrick et al. | |
| 8,492,164 B2 | 7/2013 | Fitzgerald et al. | |
| 8,506,674 B1 | 8/2013 | Brown-Fitzpatrick et al. | |
| 8,506,799 B2 | 8/2013 | Jorden et al. | |
| 8,516,266 B2 | 8/2013 | Hoffberg et al. | |
| 8,519,250 B2 | 8/2013 | Ludwig | |
| 8,525,673 B2 | 9/2013 | Tran | |
| 8,525,687 B2 | 9/2013 | Tran | |
| 8,526,632 B2 | 9/2013 | Cutler | |
| 8,531,291 B2 | 9/2013 | Tran | |
| 8,539,840 B2 | 9/2013 | Ariessohn et al. | |
| 8,542,484 B2 | 9/2013 | Tanaka | |
| 8,544,573 B2 | 10/2013 | Gettings et al. | |
| 8,547,519 B2 | 10/2013 | Streefkerk et al. | |
| 8,547,692 B2 | 10/2013 | El-Essawy et al. | |
| 8,559,197 B2 | 10/2013 | Cullinane et al. | |
| 8,568,330 B2 | 10/2013 | Mollicone et al. | |
| 8,577,184 B2 | 11/2013 | Young | |
| 8,578,494 B1 | 11/2013 | Engler et al. | |

(56) References Cited

U.S. PATENT DOCUMENTS

| | | |
|---|---|---|
| 8,583,263 B2 | 11/2013 | Hoffberg et al. |
| 8,591,430 B2 | 11/2013 | Amurthur et al. |
| 8,595,001 B2 | 11/2013 | Malah et al. |
| 8,596,821 B2 | 12/2013 | Brandes et al. |
| 8,598,730 B2 | 12/2013 | Freda |
| 8,600,830 B2 | 12/2013 | Hoffberg |
| 8,602,599 B2 | 12/2013 | Zimmer et al. |
| 8,608,838 B2 | 12/2013 | Wong et al. |
| 8,621,867 B2 | 1/2014 | Galbraith |
| 8,623,212 B2 | 1/2014 | Irvin, Sr. et al. |
| 8,633,437 B2 | 1/2014 | Dantus et al. |
| 8,634,056 B2 | 1/2014 | Streefkerk et al. |
| 8,636,910 B2 | 1/2014 | Irvin, Sr. et al. |
| 8,641,194 B2 | 2/2014 | Primeau et al. |
| 8,651,704 B1 | 2/2014 | Gordin et al. |
| 8,653,828 B2 | 2/2014 | Hancock et al. |
| 8,655,482 B2 | 2/2014 | Merrow |
| 8,666,196 B2 | 3/2014 | Young |
| 8,680,754 B2 | 3/2014 | Premysler |
| 8,680,991 B2 | 3/2014 | Tran |
| 8,684,900 B2 | 4/2014 | Tran |
| 8,684,925 B2 | 4/2014 | Manicka et al. |
| 8,695,431 B2 | 4/2014 | Pearce |
| 8,697,433 B2 | 4/2014 | Oh et al. |
| 8,701,276 B2 | 4/2014 | Burke et al. |
| 8,707,729 B2 | 4/2014 | Schmidt et al. |
| 8,718,752 B2 | 5/2014 | Libbus et al. |
| 8,725,676 B1 | 5/2014 | Engler et al. |
| 8,725,677 B1 | 5/2014 | Engler et al. |
| 8,750,971 B2 | 6/2014 | Tran |
| 8,759,721 B1 | 6/2014 | Alexander |
| 8,764,243 B2 | 7/2014 | Zimmer et al. |
| 8,764,651 B2 | 7/2014 | Tran |
| 8,771,499 B2 | 7/2014 | McCutchen et al. |
| 8,784,540 B2 | 7/2014 | Rubit et al. |
| 8,790,257 B2 | 7/2014 | Libbus et al. |
| 8,790,259 B2 | 7/2014 | Katra et al. |
| 8,792,978 B2 | 7/2014 | Wells et al. |
| 8,794,927 B2 | 8/2014 | Vassilicos |
| 8,808,113 B2 | 8/2014 | Aoyama et al. |
| 8,813,880 B2 | 8/2014 | Gettings et al. |
| 8,822,148 B2 | 9/2014 | Ismagilov et al. |
| 8,829,799 B2 | 9/2014 | Recker et al. |
| 8,839,527 B2 | 9/2014 | Ben-Shmuel et al. |
| 8,847,548 B2 | 9/2014 | Kesler et al. |
| 8,854,728 B1 | 10/2014 | Brooks et al. |
| 8,858,029 B2 | 10/2014 | Brandes et al. |
| 8,859,876 B2 | 10/2014 | Ludwig |
| 8,861,075 B2 | 10/2014 | Dantus et al. |
| 8,873,168 B2 | 10/2014 | Boone |
| 8,874,477 B2 | 10/2014 | Hoffberg |
| 8,875,086 B2 | 10/2014 | Verghese et al. |
| 8,877,072 B2 | 11/2014 | Sahai et al. |
| 8,882,552 B2 | 11/2014 | Lambert |
| 8,883,423 B2 | 11/2014 | Neely |
| 8,889,083 B2 | 11/2014 | Ismagilov et al. |
| 8,892,495 B2 | 11/2014 | Hoffberg et al. |
| 8,897,868 B2 | 11/2014 | Mazar et al. |
| 8,901,778 B2 | 12/2014 | Kesler et al. |
| 8,901,779 B2 | 12/2014 | Kesler et al. |
| 8,907,531 B2 | 12/2014 | Hall et al. |
| 8,912,687 B2 | 12/2014 | Kesler et al. |
| 8,917,962 B1 | 12/2014 | Nichol et al. |
| 8,922,066 B2 | 12/2014 | Kesler et al. |
| 8,922,153 B2 | 12/2014 | Nashiki et al. |
| 8,928,276 B2 | 1/2015 | Kesler et al. |
| 8,933,594 B2 | 1/2015 | Kurs et al. |
| 8,937,399 B2 | 1/2015 | Freda |
| 8,937,408 B2 | 1/2015 | Ganem et al. |
| 8,937,482 B1 | 1/2015 | Lemczyk |
| 8,939,081 B1 | 1/2015 | Smith et al. |
| 8,940,361 B2 | 1/2015 | Smith et al. |
| 8,946,938 B2 | 2/2015 | Kesler et al. |
| 8,947,186 B2 | 2/2015 | Kurs et al. |
| 8,947,430 B1 | 2/2015 | Green et al. |
| 8,948,253 B2 | 2/2015 | Reckwerdt et al. |
| 8,957,549 B2 | 2/2015 | Kesler et al. |
| 8,961,667 B2 | 2/2015 | McCutchen et al. |
| 8,965,498 B2 | 2/2015 | Katra et al. |
| 8,968,585 B2 | 3/2015 | Malik et al. |
| 8,977,588 B1 | 3/2015 | Engler et al. |
| 8,994,276 B2 | 3/2015 | Recker et al. |
| 9,003,846 B2 | 4/2015 | Isei et al. |
| 9,011,646 B2 | 4/2015 | McCutchen et al. |
| 9,023,216 B2 | 5/2015 | Kochergin et al. |
| 9,028,405 B2 | 5/2015 | Tran |
| 9,035,499 B2 | 5/2015 | Kesler et al. |
| 9,042,967 B2 | 5/2015 | Dacosta et al. |
| 9,045,651 B2 | 6/2015 | Chen et al. |
| 9,046,227 B2 | 6/2015 | David et al. |
| 9,046,493 B2 | 6/2015 | Neely et al. |
| 9,050,888 B2 | 6/2015 | Gettings et al. |
| 9,061,267 B2 | 6/2015 | Gottschall et al. |
| 9,062,263 B2 | 6/2015 | Sevastyanov |
| 9,062,854 B2 | 6/2015 | Livesay et al. |
| 9,065,423 B2 | 6/2015 | Ganem et al. |
| 9,067,821 B2 | 6/2015 | Bleecher et al. |
| 9,085,019 B2 | 7/2015 | Zhang et al. |
| 9,086,213 B2 | 7/2015 | Harbers et al. |
| 9,089,016 B2 | 7/2015 | Recker et al. |
| 9,090,890 B2 | 7/2015 | Malik et al. |
| 9,090,891 B2 | 7/2015 | Madero et al. |
| 9,091,865 B2 | 7/2015 | Hofmann et al. |
| 9,098,889 B2 | 8/2015 | Zhao et al. |
| 9,103,540 B2 | 8/2015 | Wyrick et al. |
| 9,106,203 B2 | 8/2015 | Kesler et al. |
| 9,107,586 B2 | 8/2015 | Tran |
| 9,121,801 B2 | 9/2015 | Clark et al. |
| 9,123,467 B2 | 9/2015 | Wu et al. |
| 9,125,566 B2 | 9/2015 | Libbus et al. |
| 9,125,574 B2 | 9/2015 | Zia et al. |
| 9,134,079 B2 | 9/2015 | Tonkovich et al. |
| 9,134,622 B2 | 9/2015 | Streefkerk et al. |
| 9,134,623 B2 | 9/2015 | Streefkerk et al. |
| 9,137,548 B2 | 9/2015 | Li et al. |
| 9,138,699 B2 | 9/2015 | Kulkarni et al. |
| 9,155,849 B2 | 10/2015 | Haroutunian |
| 9,162,260 B2 | 10/2015 | Dumontier et al. |
| 9,165,717 B2 | 10/2015 | Yializis et al. |
| 9,167,633 B2 | 10/2015 | Ben-Shmuel et al. |
| 9,169,014 B2 | 10/2015 | Elson et al. |
| 9,173,615 B2 | 11/2015 | Katra et al. |
| 9,186,089 B2 | 11/2015 | Mazar et al. |
| 9,197,904 B2 | 11/2015 | Li et al. |
| 9,204,796 B2 | 12/2015 | Tran |
| 9,207,341 B2 | 12/2015 | Pearce |
| 9,207,408 B1 | 12/2015 | Di Teodoro et al. |
| 9,228,785 B2 | 1/2016 | Poltorak |
| 9,233,862 B2 | 1/2016 | Bose et al. |
| 9,239,951 B2 | 1/2016 | Hoffberg et al. |
| 9,248,501 B1 | 2/2016 | Johannes et al. |
| 9,254,496 B2 | 2/2016 | Dhiman et al. |
| 9,256,001 B2 | 2/2016 | Pearce |
| 9,261,251 B1 | 2/2016 | Ladewig et al. |
| 9,262,723 B2 | 2/2016 | Luvalle |
| 9,269,489 B2 | 2/2016 | Wu et al. |
| 9,278,362 B2 | 3/2016 | Wells et al. |
| 9,278,374 B2 | 3/2016 | Wohl, Jr. et al. |
| 9,279,073 B2 | 3/2016 | Bleecher et al. |
| 9,284,520 B2 | 3/2016 | Malik et al. |
| 9,292,916 B2 | 3/2016 | Rowe |
| 9,309,162 B2 | 4/2016 | Azimi et al. |
| 9,311,670 B2 | 4/2016 | Hoffberg |
| 9,312,701 B1 | 4/2016 | Mor et al. |
| 9,314,181 B2 | 4/2016 | Brockway et al. |
| 9,318,257 B2 | 4/2016 | Lou et al. |
| 9,320,131 B2 | 4/2016 | Williams |
| 9,320,443 B2 | 4/2016 | Libbus et al. |
| 9,326,697 B2 | 5/2016 | Linker |
| 9,329,107 B2 | 5/2016 | Ismagilov et al. |
| 9,339,459 B2 | 5/2016 | York et al. |
| 9,339,616 B2 | 5/2016 | Denny et al. |
| 9,340,802 B2 | 5/2016 | Trevethick |
| 9,346,063 B2 | 5/2016 | Barbee et al. |

(56) References Cited

U.S. PATENT DOCUMENTS

| | | |
|---|---|---|
| 9,351,353 B2 | 5/2016 | Recker et al. |
| 9,351,928 B2 | 5/2016 | Staniforth et al. |
| 9,355,774 B2 | 5/2016 | Mathieu et al. |
| 9,360,457 B2 | 6/2016 | Neely et al. |
| 9,371,173 B2 | 6/2016 | Smith et al. |
| 9,381,528 B2 | 7/2016 | Dhiman et al. |
| 9,384,885 B2 | 7/2016 | Karalis et al. |
| 9,387,892 B2 | 7/2016 | Gettings et al. |
| 9,389,204 B2 | 7/2016 | Cloutier et al. |
| 9,392,669 B2 | 7/2016 | Recker et al. |
| 9,399,999 B2 | 7/2016 | Horng et al. |
| 9,432,298 B1 | 8/2016 | Smith |
| 9,435,524 B2 | 9/2016 | Athalye |
| 9,803,623 B2 | 10/2017 | Burkle |
| 9,901,002 B2 | 2/2018 | Jenkins |
| 9,961,812 B2 | 5/2018 | Suorsa |
| 10,041,745 B2 | 8/2018 | Poltorak |
| 10,061,514 B2 | 8/2018 | Ignomirello |
| 10,084,239 B2 | 9/2018 | Shaver et al. |
| 10,120,607 B2 | 11/2018 | Ignomirello |
| 10,285,312 B2 | 5/2019 | Suorsa |
| 10,346,047 B2 | 7/2019 | Ignomirello |
| 10,352,303 B2 | 7/2019 | Burkle |
| 10,512,140 B2 | 12/2019 | Alexander |
| 10,527,368 B2 | 1/2020 | Poltorak |
| 10,570,884 B2 | 2/2020 | Burkle |
| 10,572,186 B2 | 2/2020 | Sicola et al. |
| 10,606,482 B2 | 3/2020 | Ignomirello |
| 10,725,452 B2 | 7/2020 | Elber et al. |
| 10,773,214 B2 | 9/2020 | Nosrati |
| 10,779,384 B2 | 9/2020 | Alexander |
| 10,789,137 B2 | 9/2020 | Ignomirello et al. |
| 10,811,331 B2 | 10/2020 | Xia et al. |
| 10,830,545 B2 | 11/2020 | Poltorak |
| 10,852,069 B2 | 12/2020 | Poltorak |
| 2001/0001064 A1 | 5/2001 | Holaday |
| 2001/0031238 A1 | 10/2001 | Omaru et al. |
| 2001/0032814 A1 | 10/2001 | Kearney et al. |
| 2001/0052343 A1 | 12/2001 | Reedy et al. |
| 2001/0053741 A1 | 12/2001 | Micco et al. |
| 2001/0056316 A1 | 12/2001 | Johnson et al. |
| 2002/0005108 A1 | 1/2002 | Ludwig |
| 2002/0010710 A1 | 1/2002 | Binnig |
| 2002/0015150 A1 | 2/2002 | Armstrong et al. |
| 2002/0032510 A1 | 3/2002 | Turnbull et al. |
| 2002/0033992 A1 | 3/2002 | Den Bossche et al. |
| 2002/0056358 A1 | 5/2002 | Ludwig |
| 2002/0058469 A1 | 5/2002 | Pinheiro et al. |
| 2002/0062648 A1 | 5/2002 | Ghoshal |
| 2002/0079845 A1 | 6/2002 | Kirkpatrick et al. |
| 2002/0080563 A1 | 6/2002 | Pence et al. |
| 2002/0083780 A1 | 7/2002 | Lutz et al. |
| 2002/0107638 A1 | 8/2002 | Intriligator et al. |
| 2002/0113719 A1 | 8/2002 | Muller et al. |
| 2002/0128554 A1 | 9/2002 | Seward |
| 2002/0151992 A1 | 10/2002 | Hoffberg et al. |
| 2002/0167282 A1 | 11/2002 | Kirkpatrick et al. |
| 2002/0196706 A1 | 12/2002 | Kearney |
| 2003/0030430 A1 | 2/2003 | Pfahnl et al. |
| 2003/0032950 A1 | 2/2003 | Altshuler et al. |
| 2003/0041801 A1 | 3/2003 | Hehmann |
| 2003/0050219 A1 | 3/2003 | Micco et al. |
| 2003/0065401 A1 | 4/2003 | Amrich et al. |
| 2003/0093278 A1 | 5/2003 | Malah |
| 2003/0093279 A1 | 5/2003 | Malah et al. |
| 2003/0094141 A1 | 5/2003 | Davis |
| 2003/0100824 A1 | 5/2003 | Warren et al. |
| 2003/0137442 A1 | 7/2003 | Baliarda |
| 2003/0150232 A1 | 8/2003 | Brudnicki |
| 2003/0155110 A1 | 8/2003 | Joshi et al. |
| 2003/0156738 A1 | 8/2003 | Gerson et al. |
| 2003/0160457 A1 | 8/2003 | Ragwitz et al. |
| 2003/0162835 A1 | 8/2003 | Staniforth et al. |
| 2003/0165436 A1 | 9/2003 | Staniforth et al. |
| 2003/0171667 A1 | 9/2003 | Seward |
| 2003/0175566 A1 | 9/2003 | Fisher et al. |
| 2003/0182246 A1 | 9/2003 | Johnson et al. |
| 2003/0183368 A1 | 10/2003 | Paradis et al. |
| 2003/0184450 A1 | 10/2003 | Muller et al. |
| 2003/0207338 A1 | 11/2003 | Sklar et al. |
| 2003/0220740 A1 | 11/2003 | Intriligator et al. |
| 2003/0232020 A1 | 12/2003 | York et al. |
| 2003/0235919 A1 | 12/2003 | Chandler |
| 2004/0006566 A1 | 1/2004 | Taylor et al. |
| 2004/0024937 A1 | 2/2004 | Duncan et al. |
| 2004/0065187 A1 | 4/2004 | Ludwig |
| 2004/0069125 A1 | 4/2004 | Ludwig |
| 2004/0069126 A1 | 4/2004 | Ludwig |
| 2004/0069127 A1 | 4/2004 | Ludwig |
| 2004/0069128 A1 | 4/2004 | Ludwig |
| 2004/0069129 A1 | 4/2004 | Ludwig |
| 2004/0069131 A1 | 4/2004 | Ludwig |
| 2004/0074379 A1 | 4/2004 | Ludwig |
| 2004/0078219 A1 | 4/2004 | Kaylor et al. |
| 2004/0094021 A1 | 5/2004 | Ludwig |
| 2004/0099127 A1 | 5/2004 | Ludwig |
| 2004/0099128 A1 | 5/2004 | Ludwig |
| 2004/0099129 A1 | 5/2004 | Ludwig |
| 2004/0099131 A1 | 5/2004 | Ludwig |
| 2004/0104934 A1 | 6/2004 | Fager et al. |
| 2004/0118268 A1 | 6/2004 | Ludwig |
| 2004/0123864 A1 | 7/2004 | Hickey et al. |
| 2004/0129641 A1 | 7/2004 | Paananen et al. |
| 2004/0131688 A1 | 7/2004 | Dov et al. |
| 2004/0140252 A1 | 7/2004 | Gebauer |
| 2004/0150666 A1 | 8/2004 | Fager et al. |
| 2004/0150818 A1 | 8/2004 | Armstrong et al. |
| 2004/0163528 A1 | 8/2004 | Ludwig |
| 2004/0166414 A1 | 8/2004 | Omaru et al. |
| 2004/0169771 A1 | 9/2004 | Washington et al. |
| 2004/0171939 A1 | 9/2004 | May et al. |
| 2004/0182855 A1 | 9/2004 | Centanni |
| 2004/0187861 A1 | 9/2004 | Harrison et al. |
| 2004/0213084 A1 | 10/2004 | Kearney |
| 2004/0217011 A1 | 11/2004 | Strobel et al. |
| 2004/0238163 A1 | 12/2004 | Harman |
| 2004/0243328 A1 | 12/2004 | Rapp et al. |
| 2004/0253365 A1 | 12/2004 | Warren et al. |
| 2004/0260209 A1 | 12/2004 | Ella et al. |
| 2005/0000879 A1 | 1/2005 | Kearney et al. |
| 2005/0003737 A1 | 1/2005 | Montierth et al. |
| 2005/0008179 A1 | 1/2005 | Quinn |
| 2005/0011829 A1 | 1/2005 | Dong et al. |
| 2005/0019311 A1 | 1/2005 | Holaday et al. |
| 2005/0061221 A1 | 3/2005 | Paszkowski |
| 2005/0066538 A1 | 3/2005 | Goldberg et al. |
| 2005/0077227 A1 | 4/2005 | Kirker et al. |
| 2005/0087122 A1 | 4/2005 | Ismagilov et al. |
| 2005/0087767 A1 | 4/2005 | Fitzgerald et al. |
| 2005/0095168 A1 | 5/2005 | Centanni et al. |
| 2005/0101841 A9 | 5/2005 | Kaylor et al. |
| 2005/0106310 A1 | 5/2005 | Green et al. |
| 2005/0116336 A1 | 6/2005 | Chopra et al. |
| 2005/0120870 A1 | 6/2005 | Ludwig |
| 2005/0126373 A1 | 6/2005 | Ludwig |
| 2005/0126374 A1 | 6/2005 | Ludwig |
| 2005/0126766 A1 | 6/2005 | Lee et al. |
| 2005/0128751 A1 | 6/2005 | Roberge et al. |
| 2005/0131089 A1 | 6/2005 | Kocon et al. |
| 2005/0137032 A1 | 6/2005 | Aoyama et al. |
| 2005/0159894 A1 | 7/2005 | Intriligator et al. |
| 2005/0164281 A1 | 7/2005 | Oh et al. |
| 2005/0174473 A1 | 8/2005 | Morgan et al. |
| 2005/0187759 A1 | 8/2005 | Malah et al. |
| 2005/0213436 A1 | 9/2005 | Ono et al. |
| 2005/0220681 A1 | 10/2005 | Chang et al. |
| 2005/0245659 A1 | 11/2005 | Chen |
| 2005/0248299 A1 | 11/2005 | Chemel et al. |
| 2005/0251952 A1 | 11/2005 | Johnson |
| 2005/0265915 A1 | 12/2005 | Tonkovich et al. |
| 2005/0267685 A1 | 12/2005 | Intriligator et al. |
| 2005/0272110 A1 | 12/2005 | Drukier |
| 2005/0272159 A1 | 12/2005 | Ismagilov et al. |
| 2005/0275626 A1 | 12/2005 | Mueller et al. |

(56) References Cited

U.S. PATENT DOCUMENTS

| | | |
|---|---|---|
| 2006/0002110 A1 | 1/2006 | Dowling et al. |
| 2006/0011326 A1 | 1/2006 | Yuval |
| 2006/0018013 A1 | 1/2006 | Suzuki et al. |
| 2006/0022214 A1 | 2/2006 | Morgan et al. |
| 2006/0024435 A1 | 2/2006 | Holunga et al. |
| 2006/0025245 A1 | 2/2006 | Aoyama et al. |
| 2006/0032364 A1 | 2/2006 | Ludwig |
| 2006/0037177 A1 | 2/2006 | Blum et al. |
| 2006/0072289 A1 | 4/2006 | Rutledge et al. |
| 2006/0087509 A1 | 4/2006 | Ebert et al. |
| 2006/0090632 A1 | 5/2006 | Ludwig |
| 2006/0097855 A1 | 5/2006 | Turnbull et al. |
| 2006/0113065 A1 | 6/2006 | Wolford et al. |
| 2006/0124550 A1 | 6/2006 | Paananen et al. |
| 2006/0129161 A1 | 6/2006 | Amrich et al. |
| 2006/0148591 A1 | 7/2006 | Hebert et al. |
| 2006/0149343 A1 | 7/2006 | Altshuler et al. |
| 2006/0154352 A1 | 7/2006 | Foody et al. |
| 2006/0155398 A1 | 7/2006 | Hoffberg et al. |
| 2006/0162719 A1 | 7/2006 | Gougerot et al. |
| 2006/0165898 A1 | 7/2006 | Kodas et al. |
| 2006/0167784 A1 | 7/2006 | Hoffberg |
| 2006/0172824 A1 | 8/2006 | Nardacci et al. |
| 2006/0179676 A1 | 8/2006 | Goldberg et al. |
| 2006/0191534 A1 | 8/2006 | Hickey et al. |
| 2006/0200253 A1 | 9/2006 | Hoffberg et al. |
| 2006/0200258 A1 | 9/2006 | Hoffberg et al. |
| 2006/0200259 A1 | 9/2006 | Hoffberg et al. |
| 2006/0200260 A1 | 9/2006 | Hoffberg et al. |
| 2006/0237178 A1 | 10/2006 | Katoh et al. |
| 2006/0245987 A1 | 11/2006 | Schmidt |
| 2006/0250114 A1 | 11/2006 | Faberman et al. |
| 2006/0260638 A1 | 11/2006 | Fani et al. |
| 2006/0262876 A1 | 11/2006 | LaDue |
| 2006/0275185 A1 | 12/2006 | Tonkovich et al. |
| 2007/0016476 A1 | 1/2007 | Hoffberg et al. |
| 2007/0032733 A1 | 2/2007 | Burton |
| 2007/0041083 A1 | 2/2007 | Di Teodoro et al. |
| 2007/0041159 A1 | 2/2007 | Bate |
| 2007/0053513 A1 | 3/2007 | Hoffberg |
| 2007/0055151 A1 | 3/2007 | Shertukde et al. |
| 2007/0058346 A1 | 3/2007 | Yeh |
| 2007/0059763 A1 | 3/2007 | Okano et al. |
| 2007/0061022 A1 | 3/2007 | Hoffberg-Borghesani et al. |
| 2007/0061023 A1 | 3/2007 | Hoffberg et al. |
| 2007/0061735 A1 | 3/2007 | Hoffberg et al. |
| 2007/0070038 A1 | 3/2007 | Hoffberg et al. |
| 2007/0087756 A1 | 4/2007 | Hoffberg |
| 2007/0091948 A1 | 4/2007 | Di Teodoro et al. |
| 2007/0104431 A1 | 5/2007 | Di Teodoro et al. |
| 2007/0109542 A1 | 5/2007 | Tracy et al. |
| 2007/0121198 A1 | 5/2007 | Suzuki et al. |
| 2007/0121199 A1 | 5/2007 | Suzuki et al. |
| 2007/0121200 A1 | 5/2007 | Suzuki et al. |
| 2007/0129711 A1 | 6/2007 | Altshuler et al. |
| 2007/0131409 A1 | 6/2007 | Asahi |
| 2007/0145915 A1 | 6/2007 | Roberge et al. |
| 2007/0169928 A1 | 7/2007 | Dayan et al. |
| 2007/0172954 A1 | 7/2007 | Ismagilov et al. |
| 2007/0175472 A1 | 8/2007 | Pipkin et al. |
| 2007/0189026 A1 | 8/2007 | Chemel et al. |
| 2007/0191740 A1 | 8/2007 | Shertukde et al. |
| 2007/0206016 A1 | 9/2007 | Szymanski et al. |
| 2007/0206023 A1 | 9/2007 | Street et al. |
| 2007/0221218 A1 | 9/2007 | Warden et al. |
| 2007/0230135 A1 | 10/2007 | Feger et al. |
| 2007/0236406 A1 | 10/2007 | Wen et al. |
| 2007/0239003 A1 | 10/2007 | Shertukde et al. |
| 2007/0242955 A1 | 10/2007 | Kavehrad |
| 2007/0258329 A1 | 11/2007 | Winey |
| 2007/0267176 A1 | 11/2007 | Song et al. |
| 2007/0273504 A1 | 11/2007 | Tran |
| 2007/0276270 A1 | 11/2007 | Tran |
| 2007/0297285 A1 | 12/2007 | Cross et al. |
| 2007/0299292 A1 | 12/2007 | Cross et al. |
| 2008/0001735 A1 | 1/2008 | Tran |
| 2008/0003649 A1 | 1/2008 | Maltezos et al. |
| 2008/0004904 A1 | 1/2008 | Tran |
| 2008/0013747 A1 | 1/2008 | Tran |
| 2008/0017219 A1 | 1/2008 | Franklin |
| 2008/0024733 A1 | 1/2008 | Gerets et al. |
| 2008/0024923 A1 | 1/2008 | Tomimoto et al. |
| 2008/0036921 A1 | 2/2008 | Yokoyama et al. |
| 2008/0037927 A1 | 2/2008 | Kurihara et al. |
| 2008/0040749 A1 | 2/2008 | Hoffberg et al. |
| 2008/0043029 A1 | 2/2008 | Nardacci et al. |
| 2008/0080137 A1 | 4/2008 | Otsuki et al. |
| 2008/0103655 A1 | 5/2008 | Turnbull et al. |
| 2008/0108122 A1 | 5/2008 | Paul et al. |
| 2008/0115916 A1 | 5/2008 | Schuette |
| 2008/0121373 A1 | 5/2008 | Wang et al. |
| 2008/0121374 A1 | 5/2008 | Wang et al. |
| 2008/0135211 A1 | 6/2008 | Yassour |
| 2008/0139901 A1 | 6/2008 | Altshuler et al. |
| 2008/0145633 A1 | 6/2008 | Kodas et al. |
| 2008/0149304 A1 | 6/2008 | Slaughter |
| 2008/0151694 A1 | 6/2008 | Slater |
| 2008/0168987 A1 | 7/2008 | Denny et al. |
| 2008/0173059 A1 | 7/2008 | Gautreau et al. |
| 2008/0192576 A1 | 8/2008 | Vosburgh et al. |
| 2008/0204757 A1 | 8/2008 | Manning |
| 2008/0233356 A1 | 9/2008 | Loher et al. |
| 2008/0268246 A1 | 10/2008 | Stark et al. |
| 2008/0271777 A1 | 11/2008 | Stoner et al. |
| 2008/0278558 A1 | 11/2008 | Kojima |
| 2008/0281238 A1 | 11/2008 | Oohashi et al. |
| 2008/0294019 A1 | 11/2008 | Tran |
| 2008/0294152 A1 | 11/2008 | Altshuler et al. |
| 2008/0294153 A1 | 11/2008 | Altshuler et al. |
| 2009/0002549 A1 | 1/2009 | Kobayashi |
| 2009/0004074 A1 | 1/2009 | Tonkovich et al. |
| 2009/0016019 A1 | 1/2009 | Bandholz et al. |
| 2009/0017941 A1 | 1/2009 | Sullivan et al. |
| 2009/0021270 A1 | 1/2009 | Bandholz et al. |
| 2009/0021513 A1 | 1/2009 | Joshi et al. |
| 2009/0032104 A1 | 2/2009 | Lee et al. |
| 2009/0042200 A1 | 2/2009 | Okano et al. |
| 2009/0042739 A1 | 2/2009 | Okano et al. |
| 2009/0045967 A1 | 2/2009 | Bandholz et al. |
| 2009/0046425 A1 | 2/2009 | Kavanagh |
| 2009/0050293 A1 | 2/2009 | Kuo |
| 2009/0071624 A1 | 3/2009 | Zhang et al. |
| 2009/0074627 A1 | 3/2009 | Fitzgerald et al. |
| 2009/0079981 A1 | 3/2009 | Holve |
| 2009/0086436 A1* | 4/2009 | Kluge ................. H01L 23/3737 361/707 |
| 2009/0103296 A1 | 4/2009 | Harbers et al. |
| 2009/0135042 A1 | 5/2009 | Umishita et al. |
| 2009/0146435 A1 | 6/2009 | Freda |
| 2009/0159461 A1 | 6/2009 | McCutchen et al. |
| 2009/0161312 A1 | 6/2009 | Spearing et al. |
| 2009/0162853 A1 | 6/2009 | Clark et al. |
| 2009/0162920 A1 | 6/2009 | Vanhoutte et al. |
| 2009/0166273 A1 | 7/2009 | Mormino et al. |
| 2009/0173334 A1 | 7/2009 | Krs et al. |
| 2009/0181805 A1 | 7/2009 | Sullivan et al. |
| 2009/0200176 A1 | 8/2009 | McCutchen et al. |
| 2009/0207087 A1 | 8/2009 | Fang et al. |
| 2009/0208582 A1 | 8/2009 | Johnston et al. |
| 2009/0213382 A1 | 8/2009 | Tracy et al. |
| 2009/0217691 A1 | 9/2009 | Schmidt et al. |
| 2009/0227876 A1 | 9/2009 | Tran |
| 2009/0236333 A1 | 9/2009 | Ben-Shmuel et al. |
| 2009/0236334 A1 | 9/2009 | Ben-Shmuel et al. |
| 2009/0236335 A1 | 9/2009 | Ben-Shmuel et al. |
| 2009/0241545 A1 | 10/2009 | McCutchen |
| 2009/0245017 A1 | 10/2009 | Paul et al. |
| 2009/0261047 A1 | 10/2009 | Merrow |
| 2009/0261228 A1 | 10/2009 | Merrow |
| 2009/0262454 A1 | 10/2009 | Merrow |
| 2009/0262455 A1 | 10/2009 | Merrow |
| 2009/0265043 A1 | 10/2009 | Merrow et al. |
| 2009/0272404 A1 | 11/2009 | Kim |
| 2009/0274549 A1 | 11/2009 | Mitchell et al. |

(56) References Cited

U.S. PATENT DOCUMENTS

| | | |
|---|---|---|
| 2009/0275014 A1 | 11/2009 | Maltezos et al. |
| 2009/0275113 A1 | 11/2009 | Maltezos et al. |
| 2009/0318779 A1 | 12/2009 | Tran |
| 2009/0321045 A1* | 12/2009 | Hernon ............... H01L 23/3672 165/80.2 |
| 2009/0321046 A1 | 12/2009 | Hernon et al. |
| 2009/0321047 A1 | 12/2009 | Chen |
| 2009/0325215 A1 | 12/2009 | Okano et al. |
| 2010/0012586 A1 | 1/2010 | Angelescu et al. |
| 2010/0016568 A1 | 1/2010 | Okano et al. |
| 2010/0016569 A1 | 1/2010 | Okano et al. |
| 2010/0018862 A1 | 1/2010 | Okano et al. |
| 2010/0021634 A1 | 1/2010 | Kodas et al. |
| 2010/0021725 A1 | 1/2010 | Gottschalk-Gaudig |
| 2010/0021933 A1 | 1/2010 | Okano et al. |
| 2010/0042408 A1 | 2/2010 | Malah et al. |
| 2010/0043213 A1 | 2/2010 | Burke et al. |
| 2010/0043214 A1 | 2/2010 | Burke et al. |
| 2010/0043215 A1 | 2/2010 | Burke et al. |
| 2010/0043224 A1 | 2/2010 | Burke et al. |
| 2010/0044018 A1 | 2/2010 | Furberg et al. |
| 2010/0047043 A1 | 2/2010 | Burke et al. |
| 2010/0047044 A1 | 2/2010 | Burke et al. |
| 2010/0047052 A1 | 2/2010 | Burke et al. |
| 2010/0047053 A1 | 2/2010 | Burke et al. |
| 2010/0047962 A1 | 2/2010 | Burke et al. |
| 2010/0063393 A1 | 3/2010 | Moradi et al. |
| 2010/0067182 A1 | 3/2010 | Tanaka et al. |
| 2010/0067188 A1 | 3/2010 | Tanaka |
| 2010/0067195 A1 | 3/2010 | Tanaka |
| 2010/0067205 A1 | 3/2010 | Tanaka |
| 2010/0067206 A1 | 3/2010 | Tanaka |
| 2010/0073477 A1 | 3/2010 | Finn et al. |
| 2010/0076642 A1 | 3/2010 | Hoffberg et al. |
| 2010/0085713 A1 | 4/2010 | Balandin et al. |
| 2010/0089549 A1 | 4/2010 | Su et al. |
| 2010/0094152 A1 | 4/2010 | Semmlow |
| 2010/0100328 A1 | 4/2010 | Moore et al. |
| 2010/0101181 A1 | 4/2010 | Hamm-Dubischar |
| 2010/0110826 A1 | 5/2010 | D'herde |
| 2010/0115785 A1 | 5/2010 | Ben-Shmuel et al. |
| 2010/0115947 A1 | 5/2010 | Galbraith |
| 2010/0121318 A1 | 5/2010 | Hancock et al. |
| 2010/0136676 A1 | 6/2010 | Vanhoutte et al. |
| 2010/0139306 A1 | 6/2010 | Krenik |
| 2010/0150718 A1 | 6/2010 | Freda |
| 2010/0151267 A1 | 6/2010 | Kodas et al. |
| 2010/0165498 A1 | 7/2010 | Merrow et al. |
| 2010/0171145 A1 | 7/2010 | Morgan et al. |
| 2010/0182809 A1 | 7/2010 | Cullinane et al. |
| 2010/0195868 A1 | 8/2010 | Lu |
| 2010/0196811 A1 | 8/2010 | Gottschalk-Gaudig et al. |
| 2010/0202071 A1 | 8/2010 | Preumont et al. |
| 2010/0208065 A1 | 8/2010 | Heiner et al. |
| 2010/0219296 A1 | 9/2010 | Shelman-Cohen |
| 2010/0221343 A1 | 9/2010 | Johnston et al. |
| 2010/0221819 A1 | 9/2010 | Foody et al. |
| 2010/0226202 A1 | 9/2010 | Vassilicos et al. |
| 2010/0233026 A1 | 9/2010 | Ismagilov et al. |
| 2010/0235285 A1 | 9/2010 | Hoffberg |
| 2010/0236236 A1 | 9/2010 | Mankame et al. |
| 2010/0252648 A1 | 10/2010 | Robinson |
| 2010/0258198 A1 | 10/2010 | Tonkovich et al. |
| 2010/0270904 A1 | 10/2010 | Kim |
| 2010/0277733 A1 | 11/2010 | Holve |
| 2010/0285142 A1 | 11/2010 | Staniforth et al. |
| 2010/0287822 A1 | 11/2010 | Wei et al. |
| 2010/0302093 A1 | 12/2010 | Bunch et al. |
| 2010/0302678 A1 | 12/2010 | Merrow |
| 2010/0307665 A1 | 12/2010 | McCutchen |
| 2010/0311070 A1 | 12/2010 | Oh et al. |
| 2010/0314985 A1 | 12/2010 | Premysler |
| 2010/0317420 A1 | 12/2010 | Hoffberg |
| 2011/0004513 A1 | 1/2011 | Hoffberg |
| 2011/0029922 A1 | 2/2011 | Hoffberg et al. |
| 2011/0031236 A1 | 2/2011 | Ben-Shmuel et al. |
| 2011/0032632 A1 | 2/2011 | Erden |
| 2011/0039078 A1 | 2/2011 | Brennan Fournet et al. |
| 2011/0049904 A1 | 3/2011 | Freda |
| 2011/0060533 A1 | 3/2011 | Jorden et al. |
| 2011/0075903 A1 | 3/2011 | Turiel Martinez |
| 2011/0080802 A1 | 4/2011 | Vassilicos et al. |
| 2011/0083825 A1 | 4/2011 | Merrow |
| 2011/0092817 A1 | 4/2011 | Cloutier et al. |
| 2011/0093099 A1 | 4/2011 | Tran et al. |
| 2011/0109910 A1 | 5/2011 | Georgakoudi et al. |
| 2011/0115358 A1 | 5/2011 | Kim |
| 2011/0115624 A1 | 5/2011 | Tran |
| 2011/0117025 A1 | 5/2011 | Dacosta et al. |
| 2011/0133655 A1 | 6/2011 | Recker et al. |
| 2011/0142734 A1 | 6/2011 | Ismagilov et al. |
| 2011/0152729 A1 | 6/2011 | Oohashi et al. |
| 2011/0156896 A1 | 6/2011 | Hoffberg et al. |
| 2011/0167110 A1 | 7/2011 | Hoffberg et al. |
| 2011/0172807 A1 | 7/2011 | Merrow |
| 2011/0174462 A1 | 7/2011 | Arik et al. |
| 2011/0174468 A1 | 7/2011 | Lu et al. |
| 2011/0174622 A1 | 7/2011 | Ismagilov et al. |
| 2011/0176966 A1 | 7/2011 | Ismagilov et al. |
| 2011/0177494 A1 | 7/2011 | Ismagilov et al. |
| 2011/0177586 A1 | 7/2011 | Ismagilov et al. |
| 2011/0177609 A1 | 7/2011 | Ismagilov et al. |
| 2011/0179950 A1 | 7/2011 | Wong et al. |
| 2011/0181422 A1 | 7/2011 | Tran |
| 2011/0182068 A1 | 7/2011 | Harbers et al. |
| 2011/0202150 A1 | 8/2011 | Tran et al. |
| 2011/0226460 A1 | 9/2011 | Sommer |
| 2011/0240382 A1 | 10/2011 | Gettings et al. |
| 2011/0240383 A1 | 10/2011 | Gettings et al. |
| 2011/0253629 A1 | 10/2011 | Jovanovic et al. |
| 2011/0265480 A1 | 11/2011 | McCutchen |
| 2011/0280019 A1 | 11/2011 | Zimmer et al. |
| 2011/0292596 A1 | 12/2011 | El-Essawy et al. |
| 2011/0298371 A1 | 12/2011 | Brandes et al. |
| 2011/0311769 A1 | 12/2011 | Chen et al. |
| 2012/0009668 A1 | 1/2012 | Hass |
| 2012/0017232 A1 | 1/2012 | Hoffberg et al. |
| 2012/0026506 A1 | 2/2012 | Primeau et al. |
| 2012/0026770 A1 | 2/2012 | West |
| 2012/0031272 A1 | 2/2012 | Rubit et al. |
| 2012/0035767 A1 | 2/2012 | Runkana et al. |
| 2012/0036016 A1 | 2/2012 | Hoffberg et al. |
| 2012/0040778 A1 | 2/2012 | Aoyama et al. |
| 2012/0043037 A1 | 2/2012 | Polat et al. |
| 2012/0057974 A1 | 3/2012 | Freda |
| 2012/0064243 A1 | 3/2012 | Akay et al. |
| 2012/0074051 A1 | 3/2012 | Gebauer et al. |
| 2012/0074062 A1 | 3/2012 | Jovanovic et al. |
| 2012/0080944 A1 | 4/2012 | Recker et al. |
| 2012/0088608 A1 | 4/2012 | Sullivan et al. |
| 2012/0092157 A1 | 4/2012 | Tran |
| 2012/0095352 A1 | 4/2012 | Tran |
| 2012/0097591 A1 | 4/2012 | Berthold et al. |
| 2012/0105020 A1 | 5/2012 | Scott et al. |
| 2012/0112531 A1 | 5/2012 | Kesler et al. |
| 2012/0112532 A1 | 5/2012 | Kesler et al. |
| 2012/0112534 A1 | 5/2012 | Kesler et al. |
| 2012/0112535 A1 | 5/2012 | Karalis et al. |
| 2012/0112536 A1 | 5/2012 | Karalis et al. |
| 2012/0112538 A1 | 5/2012 | Kesler et al. |
| 2012/0112691 A1 | 5/2012 | Kurs et al. |
| 2012/0114709 A1 | 5/2012 | Staniforth et al. |
| 2012/0116769 A1 | 5/2012 | Malah et al. |
| 2012/0119569 A1 | 5/2012 | Karalis et al. |
| 2012/0119575 A1 | 5/2012 | Kurs et al. |
| 2012/0119576 A1 | 5/2012 | Kesler et al. |
| 2012/0119698 A1 | 5/2012 | Karalis et al. |
| 2012/0138058 A1 | 6/2012 | Fu et al. |
| 2012/0142814 A1 | 6/2012 | Kanagasabapathy et al. |
| 2012/0150651 A1 | 6/2012 | Hoffberg et al. |
| 2012/0152626 A1 | 6/2012 | Gettings et al. |
| 2012/0152627 A1 | 6/2012 | Gettings et al. |
| 2012/0160030 A1 | 6/2012 | Pearce |
| 2012/0161580 A1 | 6/2012 | Pearce |

(56) References Cited

U.S. PATENT DOCUMENTS

| | | |
|---|---|---|
| 2012/0163119 A1 | 6/2012 | Pearce |
| 2012/0163120 A1 | 6/2012 | Pearce |
| 2012/0164184 A1 | 6/2012 | Pipkin et al. |
| 2012/0164644 A1 | 6/2012 | Neely et al. |
| 2012/0168389 A1 | 7/2012 | Kochergin et al. |
| 2012/0169267 A1 | 7/2012 | Nashiki et al. |
| 2012/0174650 A1 | 7/2012 | Ariessohn et al. |
| 2012/0175173 A1 | 7/2012 | Gettings et al. |
| 2012/0184338 A1 | 7/2012 | Kesler et al. |
| 2012/0193085 A1 | 8/2012 | Whittle et al. |
| 2012/0193221 A1 | 8/2012 | McCutchen et al. |
| 2012/0193923 A1 | 8/2012 | Freda |
| 2012/0196336 A1 | 8/2012 | McCutchen et al. |
| 2012/0228952 A1 | 9/2012 | Hall et al. |
| 2012/0228953 A1 | 9/2012 | Kesler et al. |
| 2012/0228954 A1 | 9/2012 | Kesler et al. |
| 2012/0235501 A1 | 9/2012 | Kesler et al. |
| 2012/0235502 A1 | 9/2012 | Kesler et al. |
| 2012/0235503 A1 | 9/2012 | Kesler et al. |
| 2012/0235504 A1 | 9/2012 | Kesler et al. |
| 2012/0235566 A1 | 9/2012 | Karalis et al. |
| 2012/0235567 A1 | 9/2012 | Karalis et al. |
| 2012/0235633 A1 | 9/2012 | Kesler et al. |
| 2012/0235634 A1 | 9/2012 | Hall et al. |
| 2012/0239117 A1 | 9/2012 | Kesler et al. |
| 2012/0242159 A1 | 9/2012 | Lou et al. |
| 2012/0242225 A1 | 9/2012 | Karalis et al. |
| 2012/0248886 A1 | 10/2012 | Kesler et al. |
| 2012/0248887 A1 | 10/2012 | Kesler et al. |
| 2012/0248888 A1 | 10/2012 | Kesler et al. |
| 2012/0248981 A1 | 10/2012 | Karalis et al. |
| 2012/0255548 A1 | 10/2012 | Denny et al. |
| 2012/0256494 A1 | 10/2012 | Kesler et al. |
| 2012/0261514 A1 | 10/2012 | Boone |
| 2012/0285660 A1 | 11/2012 | Poltorak |
| 2012/0292246 A1 | 11/2012 | Jovanovic et al. |
| 2012/0293952 A1 | 11/2012 | Herring et al. |
| 2012/0298037 A1 | 11/2012 | Paul et al. |
| 2012/0301888 A1 | 11/2012 | Neely et al. |
| 2012/0318671 A1 | 12/2012 | McCutchen et al. |
| 2012/0320524 A1 | 12/2012 | El-Essawy et al. |
| 2012/0329171 A1 | 12/2012 | Ismagilov et al. |
| 2012/0330109 A1 | 12/2012 | Tran |
| 2013/0001090 A1 | 1/2013 | Rubinson et al. |
| 2013/0009783 A1 | 1/2013 | Tran |
| 2013/0010257 A1 | 1/2013 | Primeau et al. |
| 2013/0018236 A1 | 1/2013 | Altshuler et al. |
| 2013/0029345 A1 | 1/2013 | Neely et al. |
| 2013/0042893 A1 | 2/2013 | Ariessohn et al. |
| 2013/0056460 A1 | 3/2013 | Ben-Shmuel et al. |
| 2013/0083960 A1 | 4/2013 | Kostrzewski et al. |
| 2013/0095494 A1 | 4/2013 | Neely |
| 2013/0098127 A1 | 4/2013 | Isei et al. |
| 2013/0101995 A1 | 4/2013 | Rustem et al. |
| 2013/0107530 A1 | 5/2013 | Wyrick et al. |
| 2013/0147598 A1 | 6/2013 | Hoffberg et al. |
| 2013/0150730 A1 | 6/2013 | Altshuler et al. |
| 2013/0155687 A1 | 6/2013 | Zimmer et al. |
| 2013/0156091 A1 | 6/2013 | Li et al. |
| 2013/0156092 A1 | 6/2013 | Li et al. |
| 2013/0156095 A1 | 6/2013 | Li et al. |
| 2013/0167441 A1 | 7/2013 | Sevastyanov |
| 2013/0170176 A1 | 7/2013 | Athalye |
| 2013/0170999 A1 | 7/2013 | Vassilicos |
| 2013/0172691 A1 | 7/2013 | Tran |
| 2013/0182214 A1 | 7/2013 | Hofmann et al. |
| 2013/0188397 A1 | 7/2013 | Wu et al. |
| 2013/0197105 A1 | 8/2013 | Pipkin et al. |
| 2013/0202182 A1 | 8/2013 | Rowe |
| 2013/0206165 A1 | 8/2013 | Busnaina et al. |
| 2013/0207468 A1 | 8/2013 | Wu et al. |
| 2013/0207601 A1 | 8/2013 | Wu et al. |
| 2013/0208560 A1 | 8/2013 | Kulkarni et al. |
| 2013/0214539 A1 | 8/2013 | Freda |
| 2013/0231574 A1 | 9/2013 | Tran |
| 2013/0231906 A1 | 9/2013 | Luvalle |
| 2013/0244238 A1 | 9/2013 | Neely et al. |
| 2013/0252373 A1 | 9/2013 | Siau et al. |
| 2013/0252848 A1 | 9/2013 | Okano et al. |
| 2013/0260367 A1 | 10/2013 | Lowery, Jr. et al. |
| 2013/0266944 A1 | 10/2013 | Neely et al. |
| 2013/0273522 A1 | 10/2013 | Lowery, Jr. et al. |
| 2013/0273523 A1 | 10/2013 | Neely et al. |
| 2013/0274712 A1 | 10/2013 | Schecter |
| 2013/0284830 A1 | 10/2013 | Wells et al. |
| 2013/0286666 A1 | 10/2013 | Bakk |
| 2013/0288873 A1 | 10/2013 | Barbee et al. |
| 2013/0299148 A1 | 11/2013 | Hernon et al. |
| 2013/0299415 A1 | 11/2013 | McCutchen |
| 2013/0306385 A1 | 11/2013 | Gettings et al. |
| 2013/0309778 A1 | 11/2013 | Lowe et al. |
| 2013/0312638 A1 | 11/2013 | Parker et al. |
| 2013/0312787 A1 | 11/2013 | Suzuki |
| 2013/0322471 A1 | 12/2013 | Rossbach |
| 2013/0334824 A1 | 12/2013 | Freda |
| 2013/0335731 A1 | 12/2013 | Jorden |
| 2013/0339216 A1 | 12/2013 | Lambert |
| 2013/0344794 A1 | 12/2013 | Shaw et al. |
| 2014/0005364 A1 | 1/2014 | Gottschall et al. |
| 2014/0021288 A1 | 1/2014 | Elson et al. |
| 2014/0037958 A1 | 2/2014 | Gerber |
| 2014/0043825 A1 | 2/2014 | Brandes et al. |
| 2014/0046023 A1 | 2/2014 | Gottschall et al. |
| 2014/0057210 A1 | 2/2014 | Malik et al. |
| 2014/0057277 A1 | 2/2014 | Malik et al. |
| 2014/0057278 A1 | 2/2014 | Madero et al. |
| 2014/0057279 A1 | 2/2014 | Malik et al. |
| 2014/0076642 A1 | 3/2014 | Gettings et al. |
| 2014/0077946 A1 | 3/2014 | Tran |
| 2014/0079782 A1 | 3/2014 | York et al. |
| 2014/0089241 A1 | 3/2014 | Hoffberg et al. |
| 2014/0096763 A1 | 4/2014 | Barmore |
| 2014/0098542 A1 | 4/2014 | Zimmer et al. |
| 2014/0107638 A1 | 4/2014 | Hancock et al. |
| 2014/0111671 A1 | 4/2014 | Cao et al. |
| 2014/0120523 A1 | 5/2014 | Lowery, Jr. et al. |
| 2014/0127790 A1 | 5/2014 | Malik et al. |
| 2014/0127796 A1 | 5/2014 | Malik et al. |
| 2014/0134678 A1 | 5/2014 | Foody et al. |
| 2014/0143064 A1 | 5/2014 | Tran |
| 2014/0163425 A1 | 6/2014 | Tran |
| 2014/0165607 A1 | 6/2014 | Alexander |
| 2014/0166575 A1 | 6/2014 | Bose et al. |
| 2014/0170646 A1 | 6/2014 | Kelley et al. |
| 2014/0173452 A1 | 6/2014 | Hoffberg et al. |
| 2014/0180153 A1 | 6/2014 | Zia et al. |
| 2014/0207463 A1 | 7/2014 | Nakanishi |
| 2014/0212006 A1 | 7/2014 | Zhao et al. |
| 2014/0217331 A1 | 8/2014 | Hata et al. |
| 2014/0218588 A1 | 8/2014 | Ifuku et al. |
| 2014/0235965 A1 | 8/2014 | Tran |
| 2014/0238012 A1 | 8/2014 | Miller |
| 2014/0249429 A1 | 9/2014 | Tran |
| 2014/0255205 A1 | 9/2014 | Shelman-Cohen |
| 2014/0266849 A1 | 9/2014 | Suorsa |
| 2014/0266850 A1 | 9/2014 | Suorsa |
| 2014/0267123 A1 | 9/2014 | Ludwig |
| 2014/0278158 A1 | 9/2014 | Miller |
| 2014/0322515 A1 | 10/2014 | Parker et al. |
| 2014/0325866 A1 | 11/2014 | McCutchen et al. |
| 2014/0326277 A1 | 11/2014 | Nettesheim et al. |
| 2014/0332081 A1 | 11/2014 | Fitzgerald et al. |
| 2014/0334653 A1 | 11/2014 | Luna et al. |
| 2014/0336953 A1 | 11/2014 | Johnson et al. |
| 2014/0338895 A1 | 11/2014 | Paulsen |
| 2014/0340870 A1 | 11/2014 | Premysler |
| 2014/0345152 A1 | 11/2014 | Ben-Shmuel et al. |
| 2014/0346055 A1 | 11/2014 | McCutchen et al. |
| 2014/0355270 A1 | 12/2014 | Brandes et al. |
| 2014/0360607 A1 | 12/2014 | Fletcher et al. |
| 2014/0360699 A1 | 12/2014 | van Schoor et al. |
| 2014/0361688 A1 | 12/2014 | Recker et al. |
| 2014/0362660 A1 | 12/2014 | Pearce |
| 2014/0369006 A1 | 12/2014 | Williams |

(56) References Cited

U.S. PATENT DOCUMENTS

| | | |
|---|---|---|
| 2014/0377826 A1 | 12/2014 | Trevethick |
| 2015/0008842 A1 | 1/2015 | Harbers et al. |
| 2015/0015869 A1 | 1/2015 | Smith et al. |
| 2015/0021108 A1 | 1/2015 | Gettings et al. |
| 2015/0023023 A1 | 1/2015 | Livesay et al. |
| 2015/0037169 A1 | 2/2015 | Veltman et al. |
| 2015/0068069 A1 | 3/2015 | Tran et al. |
| 2015/0069831 A1 | 3/2015 | Kesler et al. |
| 2015/0094914 A1 | 4/2015 | Abreu |
| 2015/0099264 A1 | 4/2015 | Ismagilov et al. |
| 2015/0105687 A1 | 4/2015 | Abreu |
| 2015/0110599 A1 | 4/2015 | Freda |
| 2015/0138355 A1 | 5/2015 | Tillotson |
| 2015/0163867 A1 | 6/2015 | Recker et al. |
| 2015/0181685 A1 | 6/2015 | Sekhar et al. |
| 2015/0183520 A1 | 7/2015 | Elson |
| 2015/0203822 A1 | 7/2015 | Tremolada et al. |
| 2015/0204559 A1 | 7/2015 | Hoffberg et al. |
| 2015/0231635 A1 | 8/2015 | Okano et al. |
| 2015/0236546 A1 | 8/2015 | Kesler et al. |
| 2015/0250646 A1 | 9/2015 | Lipford et al. |
| 2015/0251217 A1 | 9/2015 | Wohl, Jr. et al. |
| 2015/0252998 A1 | 9/2015 | Brandes et al. |
| 2015/0255994 A1 | 9/2015 | Kesler et al. |
| 2015/0282261 A1 | 10/2015 | Recker et al. |
| 2015/0287141 A1 | 10/2015 | Parker, Jr. |
| 2015/0291760 A1 | 10/2015 | Storti et al. |
| 2015/0293140 A1 | 10/2015 | Barille |
| 2015/0328601 A1 | 11/2015 | Vassilicos |
| 2015/0342093 A1 | 11/2015 | Poltorak |
| 2015/0353880 A1 | 12/2015 | Clark et al. |
| 2015/0359467 A1 | 12/2015 | Tran |
| 2015/0366006 A1 | 12/2015 | Ben-Shmuel et al. |
| 2015/0377831 A1 | 12/2015 | Wheeler et al. |
| 2016/0001108 A1 | 1/2016 | Zhou et al. |
| 2016/0005732 A1 | 1/2016 | Wood |
| 2016/0010778 A1 | 1/2016 | Malik |
| 2016/0034422 A1 | 2/2016 | Brandt |
| 2016/0045114 A1 | 2/2016 | Dacosta et al. |
| 2016/0051960 A1 | 2/2016 | Ismagilov et al. |
| 2016/0051982 A1 | 2/2016 | Rawle |
| 2016/0083025 A1 | 3/2016 | Gettings et al. |
| 2016/0087687 A1 | 3/2016 | Kesler et al. |
| 2016/0103387 A1 | 4/2016 | Nishimori et al. |
| 2016/0129361 A1 | 5/2016 | Howard |
| 2016/0138805 A1 | 5/2016 | Martin et al. |
| 2016/0140834 A1 | 5/2016 | Tran |
| 2016/0145397 A1 | 5/2016 | Kornfield et al. |
| 2016/0154126 A1 | 6/2016 | Pearce |
| 2016/0157978 A1 | 6/2016 | Tutak |
| 2016/0160795 A1 | 6/2016 | Miller |
| 2016/0176452 A1 | 6/2016 | Gettings et al. |
| 2016/0230214 A1 | 8/2016 | Barbee et al. |
| 2016/0249439 A1 | 8/2016 | Recker et al. |
| 2016/0276979 A1 | 9/2016 | Shaver et al. |
| 2016/0320149 A1 | 11/2016 | Poltorak |
| 2017/0059263 A1 | 3/2017 | Sun et al. |
| 2017/0097197 A1 | 4/2017 | Poltorak |
| 2017/0175711 A1 | 6/2017 | Burkle |
| 2017/0252701 A1 | 9/2017 | Nosrati |
| 2018/0017345 A1 | 1/2018 | Poltorak |
| 2018/0249563 A1 | 8/2018 | Alexander |
| 2018/0275637 A1 | 9/2018 | Elber et al. |
| 2018/0298882 A1 | 10/2018 | Burkle |
| 2018/0340743 A1 | 11/2018 | Poltorak |
| 2019/0021186 A1 | 1/2019 | Poltorak |
| 2019/0383269 A1 | 12/2019 | Burkle |
| 2020/0084865 A1 | 3/2020 | Alexander |
| 2020/0126891 A1 | 4/2020 | Huitink et al. |
| 2020/0149832 A1 | 5/2020 | Poltorak |
| 2020/0249119 A1 | 8/2020 | Imrie |
| 2020/0271097 A1 | 8/2020 | Burkle |
| 2020/0273769 A1 | 8/2020 | Xia et al. |
| 2020/0375013 A1 | 11/2020 | Alexander |
| 2021/0014986 A1 | 1/2021 | Xia et al. |

OTHER PUBLICATIONS

Alharbi, Ali Y., Deborah V. Pence, and Rebecca N. Cullion. "Thermal characteristics of microscale fractal-like branching channels." Journal of Heat Transfer 126.5 (2004): 744-752.

Ali Y. Alharbi et al, Thermal Characteristics of Microscale Fractal-Like Branching Channels, J. Heat Transfer, vol. 126, Issue 5, Oct. 2004.

Andrews, Earl H. "Scramjet development and testing in the United States." AIAA paper 1927 (2001): 2001.

Arovas, Daniel, "Lecture Notes on Thermodynamics and Statistical Mechanics (A Work in Progress)", U.C. San Diego, 2013.

Azar, A, et al., 2009, "Heat sink testing methods and common oversights", Qpedia Thermal E-Magazine, Jan. 2009.

Balasubramania, K. et al, Pressure Drop Characteristics and Instabilities During Flow Boiling in Parallel and Oblique Finned Microchannels—A Comparative Study, 2012.

Batten, Paul, et al. "Sub-Grid Turbulence Modeling for Unsteady Flow with Acoustic Resonance," available at www.metacomptech.com/cfd++/00/0473.pdf, last accessed Apr. 29, 2010.

Baurle, R. A., and D. R. Eklund. "Analysis of dual-mode hydrocarbon scramjet operation at Mach 4-6.5." Journal of Propulsion and Power 18.5 (2002): 990-1002.

Bentley, Peter J., and Jonathan P. Wakefield. "Generic evolutionary design." Soft Computing in Engineering Design and Manufacturing. Springer London, 1998. 289-298.

Bohr, T., M.H. Jensen, G. Paladin and A. Vulpiani. Dynamical Systems Approach to Turbulence, Cambridge University Press, 1998.

Boming Yu et al, Fractal-Like Tree Networks Reducing the Thermal Conductivity, 2006 The American Physical Society.

Bonetto, F. et al, Fourier Law, Atlanta, GA 20006.

Boris Yakobson, "Acoustic waves may cool microelectronics", Nano Letters, ACS (2010).

Boudreau, Albert H. "Hypersonic air-breathing propulsion efforts in the air force research laboratory." AIAA 3255.1 (2005):10.

Calamas, David, "Thermal Transport in Systems With Hierarchical Bifurcating Geometries", Ph.D. Dissertation The University of Alabama Tuscaloosa, 2013.

Cardy, J., G. Falkovich and K. Gawedzki (2008) Non-equilibrium statistical mechanics and turbulence. Cambridge University Press.

Chapman, Christopher L., Seri Lee, and Bill L. Schmidt. "Thermal performance of an elliptical pin fin heat sink." Semiconductor Thermal Measurement and Management Symposium, 1994. Semi-Therm X., Proceedings of 1994 IEEE/CPMT 10th. IEEE, 1994.

Chen Yongping et al, Characteristics of Heat and Fluid Flow in Fractal Tree-Like Channel Heat Sink, 2009.

Cockrell Jr, Charles E. "Technology Roadmap for Dual-Mode Scramjet Propulsion to Support Space-Access Vision Vehicle Development." (2002).

Coolingzone.com—Heat Sinks and Reynolds Analogy, http://www.coolingzone.com/library.php?read=536; downloaded from internet on Dec. 8, 2015.

Covert, Lance Nicholas. Dual-function heatsink antennas for high-density three-dimensional integration of high-power transmitters. Diss. University of Florida, 2008.

Crane, Jackson T. Radial parallel plate flow with mechanical agitation. Diss. Massachusetts Institute of Technology, 2013.

Dannelley, Daniel. Enhancement of extended surface heat transfer using fractal-like geometries. Diss. The University of Alabama Tuscaloosa, 2013.

Davidson, P. A. (2004). Turbulence: An Introduction for Scientists and Engineers. Oxford University Press. ISBN 978-0-19-852949-1; scholarpedia.org.

Dewan, A., et al. "The effect of fin spacing and material on the performance of a heat sink with circular pin fins." Proceedings of the Institution of Mechanical Engineers, Part A: Journal of Power and Energy 224.1 (2010): 35-46.

Donbar, J., et al. "Post-test analysis of flush-wall fuel injection experiments in a scramjet." AIAA Paper 3197 (2001): 2001.

Durbin P. A., and B. A. Pettersson Reif. Statistical Theory and Modeling for Turbulent Flows. Johns Wiley & Sons, 2001.

(56) References Cited

OTHER PUBLICATIONS en.wikipedia.org/wild/Chaos_theory.
en.wikipedia.org/wild/Fractal.
en.wikipedia.org/wild/Heat_sink.
en.wikipedia.org/wild/Phonon.
Escher, W., B. Michel, and D. Poulikakos. "Efficiency of optimized bifurcating tree-like and parallel microchannel networks in the cooling of electronics." International Journal of Heat and Mass Transfer 52.5 (2009): 1421-1430.
Falkovich, G., and K.R. Sreenivasan. Lessons from hydrodynamic turbulence, Physics Today, vol. 59, No. 4, pp. 43-49 (Apr. 2006).
Falkovich, G., Scholarpedia, "Cascade and scaling"; Jin, Y.; Uth, M.-F.; Kuznetsov, A. V.; Herwig, H. (Feb. 2, 2015). "Numerical investigation of the possibility of macroscopic turbulence in porous media: a direct numerical simulation study". Journal of Fluid Mechanics 766: 76-103. Bibcode:2015JFM . . . 766 . . . 76J. doi:10.1017/jfm.2015.9.
Fichera, A., and A. Pagano. "Modelling and control of rectangular natural circulation loops." International journal of heat and mass transfer 46.13 (2003): 2425-2444.
Fichera, Alberto, et al. "A modeling strategy for rectangular thermal convection loops." World Congress. vol. 15. No. 1. 2002.
Forghan, F., Goldthwaite, D., Ulinski, M., Metghalchi, M., 2001, Experimental and Theoretical Investigation of Thermal Performance of Heat Sinks, ISME May.
Fourier, J. B., 1822, Theorie analytique de la chaleur, Paris; Freeman, A., 1955, translation, Dover Publications, Inc, NY.
Frigus Primore in "A Method for Comparing Heat Sinks Based on Reynolds Analogy," available at www.frigprim.com/downloads/Reynolds_analogy_heatsinks.PDF.
Frigus Primore, "Natural Convection and Chimneys," www.frigprim.com/articles2/parallel_plchim.html.
Frigus Primore, "Natural Convection and Inclined Parallel Plates," www.frigprim.com/articles2/parallel_pl_Inc.html.
G. K. Batchelor, The theory of homogeneous turbulence. Cambridge University Press, 1953.
Garibaldi, Dott Ing Pietro. Single-phase natural circulation loops: effects of geometry and heat sink temperature on dynamic behavior and stability. Diss. Ph. D. Thesis, 2008.
Gruber, Mark, et al. "Newly developed direct-connect high-enthalpy supersonic combustion research facility." Journal of Propulsion and Power 17.6 (2001): 1296-1304.
Henry et al.; "Design Considerations for the Airframe-Integrated Scramjet"; First International Symposium on Air Breathing Engines, Marseille, France, Jun. 19-23, 1972, 56 pages.
Hone, J., Carbon Nanotubes: Thermal Properties, New York, NY 2004.
Hong, F. J., et al. "Conjugate heat transfer in fractal-shaped microchannel network heat sink for integrated microelectronic cooling application." International Journal of Heat and Mass Transfer 50.25 (2007): 4986-4998.
Incropera, F.P. and DeWitt, D.P., 1985, Introduction to heat transfer, John Wiley and sons, NY.
International Preliminary Report on Patentability and Written Opinion for counterpart application PCT/IB2011/001026 dated Feb. 9, 2016.
International Search Report for counterpart application PCT/IB2011/001026 dated Dec. 6, 2011.
Jackson, K., et al. "Calibration of a newly developed direct-connect high-enthalpy supersonic combustion research facility." AIAA paper (1998): 98-1510.
Jeggels, Y.U., Dobson, R.T., Jeggels, D.H., Comparison of the cooling performance between heat pipe and aluminium conductors for electronic equipment enclosures, Proceedings of the 14th International Heat Pipe Conference, Florianopolis, Brazil, 2007.
Jie Li et al, Computational Analysis of Nanofluid Flow in Microchannels with Applications to Micro-Heat Sinks and Bio-MEMS, Raleigh, North Carolina 2008.

Kay, Ira W., W. T. Peschke, and R. N. Guile. "Hydrocarbon-fueled scramjet combustor investigation." Journal of Propulsion and Power 8.2 (1992): 507-512.
Kolmogorov, Andrey Nikolaevich (1941). "Dissipation of Energy in the Locally Isotropic Turbulence". Proceedings of the USSR Academy of Sciences (in Russian) 32: 16-18., translated into English by Kolmogorov, Andrey Nikolaevich (Jul. 8, 1991). Proceedings of the Royal Society A 434 (1980): 15-17. Bibcode:1991RSPSA.434 . . . 15K. doi:10.1098/rspa.1991.0076.
Kolmogorov, Andrey Nikolaevich (1941). "The local structure of turbulence in incompressible viscous fluid for very large Reynolds numbers". Proceedings of the USSR Academy of Sciences (in Russian) 30: 299-303., translated into English by V. Levin. Kolmogorov, Andrey Nikolaevich (Jul. 8, 1991). Proceedings of the Royal Society A 434 (1991): 9-13. Bibcode:1991RSPSA.434 . . . 9K. doi:10.1098/rspa.1991.0075.
Kordyban, T., 1998, Hot air rises and heat sinks—Everything you know about cooling electronics is wrong, ASME Press, NY.
Lance Covert, Jenshan Lin, Dan Janning, Thomas Dalrymple, "5.8 GHz orientation-specific extruded-fin heatsink antennas for 3D RF system integration", Apr. 23, 2008 DOI: 10.1002/mop.23478, Microwave and Optical Technology Letters vol. 50, Issue 7, pp. 1826-1831, Jul. 2008.
Lasance, C.J.M and Eggink, H.J., 2001, A Method to Rank Heat Sinks in Practice: The Heat Sink Performance Tester, 21st IEEE Semi-Therm Symposium.
Lee, Y.J., "Enhanced Microchannel Heat Sinks Using Oblique Fins," IPACK 2009-89059 (2009).
Li, Wentao, et al. "Fractal-based thinned planar-array design utilizing iterative FFT technique." International Journal of Antennas and Propagation 2012 (2012).
Lienard, J.H., IV & V, 2004, A Heat Transfer Textbook, Third edition, MIT.
Liu et al, Heat Transfer and Pressure Drop in Fractal Microchannel Heat Sink for Cooling of Electronic Chips, 44 Heat Mass Transfer 221 (2007).
Liu, S., et al., "Heat Transfer and Pressure Drop in Fractal Microchannel Heat Sink for Cooling of Electronic Chips," 44 Heat Mass Transfer 221 (2007).
Liu, Y. L., X. B. Luo, and W. Liu. "Cooling behavior in a novel heat sink based on multilayer staggered honeycomb structure." J. Energy Power Eng 4.22 (2010): e28.
Liu, Yonglu, Xiaobing Luo, and Wei Liu. "MNHMT2009-18211." (2009).
ludens.cl/Electron/Thermal.html.
Mandelbrot, B.B., The Fractal Geometry of Nature. W.H. Freeman and Company. ISBN 0-7167-1186-9. (1982).
McCowan, Iain, et al. "Speech acquisition in meetings with an audio-visual sensor array." Multimedia and Expo, 2005. ICME 2005. IEEE International Conference on. IEEE, 2005.
McDonough, J. M., (2007). Introductory Lectures on Turbulence—Physics, Mathematics, and Modeling.
Meyer, Josua P., Van Der Vyver, Hilde, "Heat Transfer Characteristics of a Quadratic Koch Island Fractal Heat Exchanger", Heat Transfer Engineering, 26(9):22-29, 2005, Taylor & Francis Inc., ISSN: 0145-7632 print / 1521-0537 online, DOI: 10.1080/01457630500205638.
Mills, A.F., 1999, Heat transfer, Second edition, Prentice Hall.
MIT Media Relations, "MIT Researchers Discover New Way of Producing Electricity", Press Release; Mar. 7, 2010; 2 pages.
Naphon, Paisarn, Setha Klangchart, and Somchai Wongwises. "Numerical investigation on the heat transfer and flow in the mini-fin heat sink for CPU." International Communications in Heat and Mass Transfer 36.8 (2009): 834-840.
Nicole Delong Okamoto, Unknown, "Heat sink selection", Mechanical engineering department, San Jose State University [Jan. 27, 2010]. www.engr.sjsu.edu/ndejong/ME%20146%20files/Heat%20Sink.ppt.
Palac, Donald T., Charles J. Trefny, and Joseph M. Roche. Performance Evaluation of the NASA GTX RBCC Flowpath. National Aeronautics and Space Administration, Glenn Research Center, 2001.

(56) References Cited

OTHER PUBLICATIONS

Paul Battern, "Sub-Grid Turbulence Modeling for Unsteady Flow with Acoustic Resonance," available at www.metacomptech.com/cfd++/00-0473.pdf.
Peles, Yoav, et al. "Forced convective heat transfer across a pin fin micro heat sink." International Journal of Heat and Mass Transfer 48.17 (2005): 3615-3627.
Pence, D. V., 2002, "Reduced Pumping Power and Wall Temperature in Microchannel Heat Sinks with Fractal-like Branching Channel Networks", Microscale Thermophys. Eng. 5, pp. 293-311.
Potter, C.M. and Wigget, D.C., 2002, Mechanics of fluid, Third Edition, Brooks/Cole.
Prstic, S., Iyengar, M., and Bar-Cohen, A., 2000, Bypass effect in high performance heat sinks, Proceedings of the International Thermal Science Seminar Bled, Slovenia, Jun. 11-14.
Roknaldin, Farzam, and Arunima Panigrahy. "Board level thermal analysis via Large Eddy Simulation (LES) tool." Thermal and Thermomechanical Phenomena in Electronic Systems, 2004. ITHERM'04. The Ninth Intersociety Conference on. IEEE, 2004.
Ryan, NJ, DA Stone, "Application of the FD-TD method to modelling the electromagnetic radiation from heatsinks", IEEE International Conference on Electromagnetic Compatibility, 1997. 10th (Sep. 1-3, 1997), pp. 119-124.
Saint-Gobain, 2004, "Thermal management solutions for electronic equipment" Jul. 22, 2008 www.fff.saint-gobain.com/Media/Documents/S0000000000000001036/ThermaCool%-20Brochure.pdf.
Search Report PCT/IB11/01026 dated May 13, 2011.
Senn, S. M., et al, Laminar Mixing, Heat Transfer and Pressure Drop, Zurich, Switzerland, 2003.
Sergent, J. and Krum, A., 1998, Thermal management handbook for electronic assemblies, First Edition, McGraw-Hill.
Shaeri, M. R., and M. Yaghoubi. "Numerical analysis of turbulent convection heat transfer from an array of perforated fins." International Journal of Heat and Fluid Flow 30.2 (2009): 218-228.
Sui, Y., Teo, C. J., Lee, P. S., Chew, Y. T., & Shu, C. (2010). Fluid flow and heat transfer in wavy microchannels. International Journal of Heat and Mass Transfer, 53(13), 2760-2772.
Tavaragiri, Abhay, Jacob Couch, and Peter Athanas. "Exploration of FPGA interconnect for the design of unconventional antennas." Proceedings of the 19th ACM/SIGDA international symposium on Field programmable gate arrays. ACM, 2011.
Unknown, "Heat sink selection", Mechanical engineering department, San Jose State University [Jan. 27, 2010]. www.engr.sjsu.edu/ndejong/ME%20146%20files/Heat%20Sink.pptwww.engr.sjsu.e- du/ndejong/ME%20146%20files/Heat%20Sink.ppt.
Van der Vyver, Hilde. Heat transfer characteristics of a fractal heat exchanger. Diss. 2009.
Vijayan et al. "Investigations on the Effect of Heater and Cooler Orientation on the Steady State, Transient and Stability Behaviour of Single-Phase Natural Circulation in a Rectangular Loop"; Government of India, Bhabha Atomic Research Centre, 2001.
Wagh, Kanchan H. "A Review on Fractal Antennas for Wireless Communication." IJRECE 3.2 (2015): 37-41.
Wang et al., Flow and Thermal Characteristics of Offset Branching Network, Aug. 12, 2009, International Journal of Thermal Science, vol. 49, pp. 272-280.
Wang Xiangqi, New Approaches to Micro-Electronic Component Cooling, Doctoral Dissertation, National University of Singapore, 2007.
web.mit.edu/press/2010/thermopower-waves.html.
White, F.M., 1999, Fluid mechanics, Fourth edition, McGraw-Hill International.
Wikipedia article en.wikipedia.org/wiki/Fractal.
Wikipedia article en.wikipedia.org/wiki/Phonon.
Wikipedia article Heat Sink.org/wiki/Heatsink.
Yamaha, ProjectPhone, informational brochure.
Yong-Jiun Lee et al, Enhanced Microchannel Heat Sinks Using Oblique Fins, IPack 2009-89059, San Francisco, CA, 2009.
Zhou, Feng, and Ivan Catton. "A numerical investigation of turbulent flow and heat transfer in rectangular channels with elliptic scale-roughened walls." Journal of Heat Transfer 135.8 (2013): 081901.

\* cited by examiner

FRACTAL HEAT TRANSFER DEVICE

CROSS REFERENCE TO RELATED APPLICATIONS

The present application is a Division of U.S. patent application Ser. No. 14/817,962, filed Aug. 4, 2015, now U.S. Pat. No. 10,527,368, issued Jan. 7, 2020, which is a Continuation of U.S. patent application Ser. No. 13/106,640, filed May 12, 2011, now U.S. Pat. No. 9,228,785, issued Jan. 5, 2016, which is a non-provisional of, and claims benefit of priority under 35 U.S.C. 119(e) from, U.S. Provisional Patent Application No. 61/331,103, filed May 4, 2010, and which claims priority under 35 U.S.C. 371 from PCT Patent Application No. PCT/IB11/01026, filed May 13, 2011, the entirety of which are expressly incorporated herein by reference.

This application is related to U.S. patent application Ser. No. 14/984,756, filed Dec. 30, 2015, now U.S. Pat. No. 10,041,745, issued Aug. 7, 2018, which is a Continuation-in-part of U.S. patent application Ser. No. 14/817,962, filed Aug. 4, 2015, and U.S. patent application Ser. No. 15/205,906, filed Jul. 8, 2016, and U.S. patent application Ser. No. 16/056,481, filed Aug. 6, 2018, and PCT Patent Application No. PCT/US16/68641, filed Dec. 27, 2016,

FIELD OF THE INVENTION

This invention relates to the field of heat sinks or items that transfer heat between a concentrated source or sink and a fluid.

BACKGROUND OF THE INVENTION

A heat sink is a term for a component or assembly that transfers heat generated within a solid material to a fluid medium, such as air or a liquid. A heat sink is typically physically designed to increase the surface area in contact with the cooling fluid surrounding it, such as the air. Approach air velocity, choice of material, fin (or other protrusion) design and surface treatment are some of the design factors which influence the thermal resistance, i.e. thermal performance, of a heat sink.

A heat sink transfers thermal energy from a higher temperature to a lower temperature fluid medium. The fluid medium is frequently air, but can also be water or in the case of heat exchangers, refrigerants and oil. Fourier's law of heat conduction, simplified to a one-dimensional form in the x-direction, shows that when there is a temperature gradient in a body, heat will be transferred from the higher temperature region to the lower temperature region. The rate at which heat is transferred by conduction, $q_k$, is proportional to the product of the temperature gradient and the cross-sectional area through which heat is transferred:

$$q_k == kA \frac{dT}{dx} \qquad (1)$$

where $q_k$ is the rate of conduction, k is a constant which depends on the materials that are involved, A is the surface area through which the heat must pass, and dT/dx is the rate of change of temperature with respect to distance (for simplicity, the equation is written in one dimension). Thus, according to Fourier's law (which is not the only consideration by any means), heat sinks benefit from having a large surface area exposed to the medium into which the heat is to be transferred.

Consider a heat sink in a duct, where air flows through the duct, and the heat sink base is higher in temperature than the air. Assuming conservation of energy, for steady-state conditions, and applying Newton's law of cooling, gives the following set of equations.

$$\dot{Q} = \dot{m} c_{p,in} (T_{air,out} - T_{air,in}) \qquad (2)$$

$$\dot{Q} = \frac{T_{hs} - T_{air,av}}{R_{hs}} \qquad (3)$$

where $$T_{air,av} = \frac{T_{air,out} + T_{air,in}}{2} \qquad (4)$$

and $\dot{Q}$ is the first derivative of the thermal energy over time—

$$\dot{Q} = \frac{dQ}{dt}.$$

Using the mean air temperature is an assumption that is valid for relatively short heat sinks. When compact heat exchangers are calculated, the logarithmic mean air temperature is used. $\dot{m}$ is the air mass flow rate in kg/s.

The above equations show that when the air flow through the heat sink decreases, this results in an increase in the average air temperature. This in turn increases the heat sink base temperature. And additionally, the thermal resistance of the heat sink will also increase. The net result is a higher heat sink base temperature. The inlet air temperature relates strongly with the heat sink base temperature. Therefore, if there is no air or fluid flow around the heat sink, the energy dissipated to the air cannot be transferred to the ambient air. Therefore, the heat sink functions poorly.

Other examples of situations in which a heat sink has impaired efficiency: Pin fins have a lot of surface area, but the pins are so close together that air has a hard time flowing through them; Aligning a heat sink so that the fins are not in the direction of flow; Aligning the fins horizontally for a natural convection heat sink. Whilst a heat sink is stationary and there are no centrifugal forces and artificial gravity, air that is warmer than the ambient temperature always flows upward, given essentially-still-air surroundings; this is convective cooling.

The most common heat sink material is aluminum. Chemically pure aluminum is not used in the manufacture of heat sinks, but rather aluminum alloys. Aluminum alloy 1050A has one of the higher thermal conductivity values at 229 W/m·K. However, it is not recommended for machining, since it is a relatively soft material. Aluminum alloys 6061 and 6063 are the more commonly used aluminum alloys, with thermal conductivity values of 166 and 201 W/m·K, respectively. The aforementioned values are dependent on the temper of the alloy.

Copper is also used since it has around twice the conductivity of aluminum, but is three times as heavy as aluminum. Copper is also around four to six times more expensive than aluminum, but this is market dependent. Aluminum has the added advantage that it is able to be extruded, while copper cannot. Copper heat sinks are machined and skived. Another method of manufacture is to solder the fins into the heat sink base.

Another heat sink material that can be used is diamond. With a value of 2000 W/mK it exceeds that of copper by a factor of five. In contrast to metals, where heat is conducted by delocalized electrons, lattice vibrations are responsible for diamond's very high thermal conductivity. For thermal management applications, the outstanding thermal conductivity and diffusivity of diamond is an essential. CVD diamond may be used as a sub-mount for high-power integrated circuits and laser diodes.

Composite materials can be used. Examples are a copper-tungsten pseudoalloy, AlSiC (silicon carbide in aluminum matrix), Dymalloy (diamond in copper-silver alloy matrix), and E-Material (beryllium oxide in beryllium matrix). Such materials are often used as substrates for chips, as their thermal expansion coefficient can be matched to ceramics and semiconductors.

Fin efficiency is one of the parameters which makes a higher thermal conductivity material important. A fin of a heat sink may be considered to be a flat plate with heat flowing in one end and being dissipated into the surrounding fluid as it travels to the other. As heat flows through the fin, the combination of the thermal resistance of the heat sink impeding the flow and the heat lost due to convection, the temperature of the fin and, therefore, the heat transfer to the fluid, will decrease from the base to the end of the fin. This factor is called the fin efficiency and is defined as the actual heat transferred by the fin, divided by the heat transfer were the fin to be isothermal (hypothetically the fin having infinite thermal conductivity). Equations 5 and 6 are applicable for straight fins.

$$\eta_f = \frac{\tanh(mL_c)}{mL_c} \quad (5)$$

$$mL_c = \sqrt{\frac{2h_f}{kt_f}} L_f \quad (6)$$

Where:
$h_f$ is the convection coefficient of the fin
  Air: 10 to 100 W/(m²·K)
  Water: 500 to 10,000 W/(m²·K)
k is the thermal conductivity of the fin material
  Aluminum: 120 to 240 W/(m²·K)
$L_f$ is the fin height (m)
$t_f$ is the fin thickness (m)

Another parameter that concerns the thermal conductivity of the heat sink material is spreading resistance. Spreading resistance occurs when thermal energy is transferred from a small area to a larger area in a substance with finite thermal conductivity. In a heat sink, this means that heat does not distribute uniformly through the heat sink base. The spreading resistance phenomenon is shown by how the heat travels from the heat source location and causes a large temperature gradient between the heat source and the edges of the heat sink. This means that some fins are at a lower temperature than if the heat source were uniform across the base of the heat sink. This non-uniformity increases the heat sink's effective thermal resistance.

A pin fin heat sink is a heat sink that has pins that extend from its base. The pins can be, for example, cylindrical, elliptical or square. A second type of heat sink fin arrangement is the straight fin. These run the entire length of the heat sink. A variation on the straight fin heat sink is a cross cut heat sink. A straight fin heat sink is cut at regular intervals but at a coarser pitch than a pin fin type.

In general, the more surface area a heat sink has, the better it works. However, this is not always true. The concept of a pin fin heat sink is to try to pack as much surface area into a given volume as possible. As well, it works well in any orientation. Kordyban has compared the performance of a pin fin and a straight fin heat sink of similar dimensions. Although the pin fin has 194 cm² surface area while the straight fin has 58 cm², the temperature difference between the heat sink base and the ambient air for the pin fin is 50° C. For the straight fin it was 44° C. or 6° C. better than the pin fin. Pin fin heat sink performance is significantly better than straight fins when used in their intended application where the fluid flows axially along the pins rather than only tangentially across the pins.

Another configuration is the flared fin heat sink; its fins are not parallel to each other, but rather diverge with increasing distance from the base. Flaring the fins decreases flow resistance and makes more air go through the heat sink fin channel; otherwise, more air would bypass the fins. Slanting them keeps the overall dimensions the same, but offers longer fins. Forghan, et al. have published data on tests conducted on pin fin, straight fin and flared fin heat sinks. They found that for low approach air velocity, typically around 1 m/s, the thermal performance is at least 20% better than straight fin heat sinks. Lasance and Eggink also found that for the bypass configurations that they tested, the flared heat sink performed better than the other heat sinks tested.

The heat transfer from the heat sink is mediated by two effects: conduction via the coolant, and thermal radiation. The surface of the heat sink influences its emissivity; shiny metal absorbs and radiates only a small amount of heat, while matte black radiates highly. In coolant-mediated heat transfer, the contribution of radiation is generally small. A layer of coating on the heat sink can then be counterproductive, as its thermal resistance can impair heat flow from the fins to the coolant. Finned heat sinks with convective or forced flow will not benefit significantly from being colored. In situations with significant contribution of radiative cooling, e.g. in case of a flat non-finned panel acting as a heat sink with low airflow, the heat sink surface finish can play an important role. Matte-black surfaces will radiate much more efficiently than shiny bare metal. The importance of radiative vs. coolant-mediated heat transfer increases in situations with low ambient air pressure (e.g. high-altitude operations) or in vacuum (e.g. satellites in space).

Fourier, J. B., 1822, Theorie analytique de la chaleur, Paris; Freeman, A., 1955, translation, Dover Publications, Inc, NY.

Kordyban, T., 1998, Hot air rises and heat sinks—Everything you know about cooling electronics is wrong, ASME Press, NY.

Anon, Unknown, "Heat sink selection", Mechanical engineering department, San Jose State University, Jan. 27, 2010. www•engr•sjsu•edu/dejong/ME%20146%20files/Heat%20Sink•pptwww•engr•sjsu•edu/ndejong/ME%20146%20files/Heat%20Sink.ppt Sergent, J. and Krum, A., 1998, Thermal management handbook for electronic assemblies, First Edition, McGraw-Hill.

Incropera, F. P. and DeWitt, D. P., 1985, Introduction to heat transfer, John Wiley and sons, NY.

Forghan, F., Goldthwaite, D., Ulinski, M., Metghalchi, M., Experimental and Theoretical Investigation of Thermal Performance of Heat Sinks, ISME May 2001.

Lasance, C. J. M and Eggink, H. J., 2001, A Method to Rank Heat Sinks in Practice: The Heat Sink Performance Tester, 21st IEEE SEMI-THERM Symposium. ludens.cl/Electron/Thermal.html Lienard, J. H., IV & V, 2004, A Heat Transfer Textbook, Third edition, MIT Saint-Gobain, 2004, "Thermal management solutions for electronic equipment" 22 Jul. 2008 www•fff•saint-gobain•com/Media/Documents/S0000000000000001036/ThermaCool %20Brochure•pdf Jeggels, Y. U., Dobson, R. T., Jeggels, D. H., Comparison of the cooling performance between heat pipe and aluminium conductors for electronic equipment enclosures, Proceedings of the 14th International Heat Pipe Conference, Florianópolis, Brazil, 2007.

Prstic, S., Iyengar, M., and Bar-Cohen, A., Bypass effect in high performance heat sinks, Proceedings of the International Thermal Science Seminar Bled, Slovenia, Jun. 11-14,2000.

Mills, A. F., 1999, Heat transfer, Second edition, Prentice Hall.

Potter, C. M. and Wiggert, D. C., 2002, Mechanics of fluid, Third Edition, Brooks/Cole.

White, F. M., 1999, Fluid mechanics, Fourth edition, McGraw-Hill International.

Azar, A, et al., 2009, "Heat sink testing methods and common oversights", Qpedia Thermal E-Magazine, January 2009 Issue. www•gats•com/cpanel/UploadedPdf/January20092•pdf Several structurally complex heatsink designs are discussed in Hernon, US App. 2009/0321045, incorporated herein by reference.

Several structurally complex heat sink designs are discussed in Hernon, US App. 2009/0321045, incorporated herein by reference.

Heat sinks operate by removing heat from an object to be cooled into the surrounding air, gas or liquid through convection and radiation. Convection occurs when heat is either carried passively from one point to another by fluid motion (forced convection) or when heat itself causes fluid motion (free convection). When forced convection and free convection occur together, the process is termed mixed convection. Radiation occurs when energy, for example in the form of heat, travels through a medium or through space and is ultimately absorbed by another body. Thermal radiation is the process by which the surface of an object radiates its thermal energy in the form of electromagnetic waves. Infrared radiation from a common household radiator or electric heater is an example of thermal radiation, as is the heat and light (IR and visible EM waves) emitted by a glowing incandescent light bulb. Thermal radiation is generated when heat from the movement of charged particles within atoms is converted to electromagnetic radiation.

A heat sink tends to decrease the maximum temperature of the exposed surface, because the power is transferred to a larger volume. This leads to a possibility of diminishing return on larger heat sinks, since the radiative and convective dissipation tends to be related to the temperature differential between the heat sink surface and the external medium. Therefore, if the heat sink is oversized, the efficiency of heat shedding is poor. If the heat sink is undersized, the object may be insufficiently cooled, the surface of the heat sink dangerously hot, and the heat shedding not much greater than the object itself absent the heat sink.

The relationship between friction and convention in heatsinks is discussed by Frigus Primore in "A Method for Comparing Heat Sinks Based on Reynolds Analogy," available at www•frigprim•com/downloads/Reynolds_analogy_heatsinks•PDF, last accessed Apr. 28, 2010.

This article notes that for, plates, parallel plates, and cylinders to be cooled, it is necessary for the velocity of the surrounding fluid to be low in order to minimize mechanical power losses. However, larger surface flow velocities will increase the heat transfer efficiency, especially where the flow near the surface is turbulent, and substantially disrupts a stagnant surface boundary layer. Primore also discusses heatsink fin shapes and notes that no fin shape offers any heat dissipation or weight advantage compared with planar fins, and that straight fins minimize pressure losses while maximizing heat flow. Therefore, the art generally teaches that generally flat and planar surfaces are appropriate for most heatsinks.

Frigus Primore, "Natural Convection and Inclined Parallel Plates," www•frigprim•com/articels2/parallel_pl_Inc•html, last accessed Apr. 29, 2010, discusses the use of natural convection (i.e., convection due to the thermal expansion of a gas surrounding a solid heatsink in normal operating conditions) to cool electronics. One of the design goals of various heatsinks is to increase the rate of natural convection. Primore suggests using parallel plates to attain this result. Once again, Primore notes that parallel plate heatsinks are the most efficient and attempts to define the optimal spacing S and angle λ (relative to the direction of the fluid flow) of the heatsink plates of length L according to the below equations:

Optimum Plate Spacing $$S_{Opt} = k_s \left(\frac{L}{dT}\right)^{0.25} \cdot \cos(\gamma)^{-0.25} \qquad (1)$$

$$\gamma_{opt} = \text{atan}\left(\frac{1H}{3W}\right)$$

$$\gamma_{opt} = \frac{\pi}{4} - 0.508\left(\frac{H}{W}\right)^{-1.237}$$

$$\frac{H}{W} < \sqrt{3}$$

$$\frac{H}{W} > \sqrt{3}$$

Total heat Dissipation $$\dot{Q} = k_v \cdot k_\gamma \cdot A_c \cdot H^{0.5} \cdot dT^{1.5} \qquad (2)$$

$$k_\gamma = \sqrt{1 + \frac{1}{9}\left(\frac{H}{W}\right)^2}$$

$$k_\gamma = 0.307 \cdot \left(\frac{H}{W}\right)^{-0.5} + 0.696 \cdot \left(\frac{H}{W}\right)^{-0.5}$$

$$\frac{H}{W} < \sqrt{3}$$

$$\frac{H}{W} > \sqrt{3}$$

Applied Equation $$\dot{Q} = \eta_v \cdot k_v \cdot k_\gamma \cdot A_c \cdot H^{0.5} \cdot dT_{ref}^{1.5} \qquad (3)$$

dT=Temperature difference (K)

$A_c$=W·D $\eta_v$=Volumetric efficiency [--]

$\dot{Q}$=Heat dissipation [W]

FIG. 1A shows the length L, spacing S, and angle λ, of the plates of a heatsink. FIG. 1B shows the spatial relationships of $A_c$, the area of a face, W, the width, D, the depth, H, the height, of a plate of a heatsink.

In another article titled "Natural Convection and Chimneys," available at www•frigprim•com/articels2/parallel_plchim•html, last accessed Apr. 29, 2010, Frigus Primore discusses the use of parallel plates in chimney heatsinks. One purpose of this type of design is to combine more efficient natural convection with a chimney. Primore notes that the design suffers if there is laminar flow (which creates a re-circulation region in the fluid outlet, thereby completely eliminating the benefit of the chimney) but benefits if there is turbulent flow which allows heat to travel from the parallel plates into the chimney and surrounding fluid.

In "Sub-Grid Turbulence Modeling for Unsteady Flow with Acoustic Resonance," available at www•metacomptech•com/cfd++/00-0473•pdf, last accessed Apr. 29, 2010, incorporated herein by reference, Paul Batten et al discuss that when a fluid is flowing around an obstacle, localized geometric features, such as concave regions or cavities, create pockets of separated flow which can generate self-sustaining oscillations and acoustic resonance. The concave regions or cavities serve to substantially reduce narrow band acoustic resonance as compared to flat surfaces. This is beneficial to a heatsink in a turbulent flow environment because it allows for the reduction of oscillations and acoustic resonance, and therefore for an increase in the energy available for heat transfer.

In S. Liu, "Heat Transfer and Pressure Drop in Fractal Microchannel Heat Sink for Cooling of Electronic Chips," 44 Heat Mass Transfer 221 (2007), Liu et al discuss a heat sink with a "fractal-like branching flow network." Liu's heat sink includes channels through which fluids would flow in order to exchange heat with the heat sink.

Y. J. Lee, "Enhanced Microchannel Heat Sinks Using Oblique Fins," IPACK 2009-89059, similarly discusses a heat sink comprising a "fractal-shaped microchannel based on the fractal pattern of mammalian circulatory and respiratory system." Lee's idea, similar to that of Liu, is that there would be channels inside the heat sink through which a fluid could flow to exchange heat with the heat sink. The stated improvement in Lee's heat sink is (1) the disruption of the thermal boundary layer development; and (2) the generation of secondary flows.

Pence, D. V., 2002, "Reduced Pumping Power and Wall Temperature in Microchannel Heat Sinks with Fractal-like Branching Channel Networks", Microscale Thermophys. Eng. 5, pp. 293-311, similarly, mentions heat sinks that have fractal-like channels allowing fluid to enter into the heat sink. The described advantage of Pence's structure is increased exposure of the heat sink to the fluid and lower pressure drops of the fluid while in the heat sink.

In general, a properly designed heat sink system will take advantage of thermally induced convection or forced air (e.g., a fan). In general, a turbulent flow near the surface of the heat sink disturbs a stagnant surface layer, and improves performance. In many cases, the heat sink operates in a non-ideal environment subject to dust or oil; therefore, the heat sink design must accommodate the typical operating conditions, in addition to the as-manufactured state.

Prior art heat sink designs have traditionally concentrated on geometry that is Euclidian, involving structures such as the pin fins, straight fins, and flares discussed above.

N J Ryan, D A Stone, "Application of the FD-TD method to modelling the electromagnetic radiation from heatsinks", IEEE International Conference on Electromagnetic Compatibility, 1997. 10th (1-3 Sep. 1997), pp: 119-124, discloses a fractal antenna which also serves as a heat sink in a radio frequency transmitter.

Lance Covert, Jenshan Lin, Dan Janning, Thomas Dalrymple, "5.8 GHz orientation-specific extruded-fin heatsink antennas for 3D RF system integration", 23 Apr. 2008 DOI: 10.1002/mop.23478, Microwave and Optical Technology Letters Volume 50, Issue 7, pages 1826-1831, July 2008 also provide a heat sink which can be used as an antenna.

Per Wikipedia en.wikipedia.org/wiki/Fractal (last accessed Apr. 14, 2010), A fractal is "a rough or fragmented geometric shape that can be split into parts, each of which is (at least approximately) a reduced-size copy of the whole," [Mandelbrot, B. B. (1982). The Fractal Geometry of Nature. W.H. Freeman and Company. ISBN 0-7167-1186-9.] a property called self-similarity. Roots of mathematically rigorous treatment of fractals can be traced back to functions studied by Karl Weierstrass, Georg Cantor and Felix Hausdorff in studying functions that were analytic but not differentiable; however, the term fractal was coined by Benoit Mandelbrot in 1975 and was derived from the Latin fractus meaning "broken" or "fractured." A mathematical fractal is based on an equation that undergoes iteration, a form of feedback based on recursion. (Briggs, John (1992). Fractals: The Patterns of Chaos. London: Thames and Hudson, 1992. p. 148.)

A fractal often has the following features: (Falconer, Kenneth (2003). Fractal Geometry: Mathematical Foundations and Applications. John Wiley & Sons, Ltd. Xxv)

It has a fine structure at arbitrarily small scales.

It is too irregular to be easily described in traditional Euclidean geometric language.

It is self-similar (at least approximately or stochastically).

It has a Hausdorff dimension which is greater than its topological dimension (although this requirement is not met by space-filling curves such as the Hilbert curve). [The Hilbert curve map is not a homeomorphism, so it does not preserve topological dimension. The topological dimension and Hausdorff dimension of the image of the Hilbert map in $R^2$ are both 2. Note, however, that the topological dimension of the graph of the Hilbert map (a set in R) is 1]

It has a simple and recursive definition.

Because they appear similar at all levels of magnification, fractals are often considered to be infinitely complex (in informal terms). Natural objects that are approximated by fractals to a degree include clouds, mountain ranges, lightning bolts, coastlines, snow flakes, various vegetables (cauliflower and broccoli), and animal coloration patterns. However, not all self-similar objects are fractals—for example, the real line (a straight Euclidean line) is formally self-similar but fails to have other fractal characteristics; for instance, it is regular enough to be described in Euclidean terms.

Images of fractals can be created using fractal-generating software. Images produced by such software are normally referred to as being fractals even if they do not have the above characteristics, such as when it is possible to zoom into a region of the fractal that does not exhibit any fractal properties. Also, these may include calculation or display artifacts which are not characteristics of true fractals.

To create a Koch snowflake, one begins with an equilateral triangle and then replaces the middle third of every line segment with a pair of line segments that form an equilateral "bump." One then performs the same replacement on every line segment of the resulting shape, ad infinitum. With every iteration, the perimeter of this shape increases by one third of the previous length. The Koch snowflake is the result of an infinite number of these iterations, and has an infinite length, while its area remains finite. For this reason, the Koch snowflake and similar constructions were sometimes called "monster curves."

The mathematics behind fractals began to take shape in the 17th century when mathematician and philosopher Gottfried Leibniz considered recursive self-similarity (although he made the mistake of thinking that only the straight line was self-similar in this sense).

It was not until 1872 that a function appeared whose graph would today be considered fractal, when Karl Weierstrass gave an example of a function with the non-intuitive property of being everywhere continuous but nowhere differentiable. In 1904, Helge von Koch, dissatisfied with Weierstrass's very abstract and analytic definition, gave a more geometric definition of a similar function, which is now called the Koch curve. (The image at right is three Koch curves put together to form what is commonly called the Koch snowflake.) Waclaw Sierpinski constructed his triangle in 1915 and, one year later, his carpet. Originally these geometric fractals were described as curves rather than the 2D shapes that they are known as in their modern constructions. The idea of self-similar curves was taken further by Paul Pierre Lévy, who, in his 1938 paper Plane or Space Curves and Surfaces Consisting of Parts Similar to the Whole described a new fractal curve, the Lévy C curve. Georg Cantor also gave examples of subsets of the real line with unusual properties—these Cantor sets are also now recognized as fractals.

Iterated functions in the complex plane were investigated in the late 19th and early 20th centuries by Henri Poincaré, Felix Klein, Pierre Fatou and Gaston Julia. Without the aid of modern computer graphics, however, they lacked the means to visualize the beauty of many of the objects that they had discovered.

In the 1960s, Benoit Mandelbrot started investigating self-similarity in papers such as How Long Is the Coast of Britain? Statistical Self-Similarity and Fractional Dimension, which built on earlier work by Lewis Fry Richardson. Finally, in 1975 Mandelbrot coined the word "fractal" to denote an object whose Hausdorff—Besicovitch dimension is greater than its topological dimension. He illustrated this mathematical definition with striking computer-constructed visualizations. These images captured the popular imagination; many of them were based on recursion, leading to the popular meaning of the term "fractal".

A class of examples is given by the Cantor sets, Sierpinski triangle and carpet, Menger sponge, dragon curve, space-filling curve, and Koch curve. Additional examples of fractals include the Lyapunov fractal and the limit sets of Kleinian groups. Fractals can be deterministic (all the above) or stochastic (that is, non-deterministic). For example, the trajectories of the Brownian motion in the plane have a Hausdorff dimension of 2.

Chaotic dynamical systems are sometimes associated with fractals. Objects in the phase space of a dynamical system can be fractals (see attractor). Objects in the parameter space for a family of systems may be fractal as well. An interesting example is the Mandelbrot set. This set contains whole discs, so it has a Hausdorff dimension equal to its topological dimension of 2—but what is truly surprising is that the boundary of the Mandelbrot set also has a Hausdorff dimension of 2 (while the topological dimension of 1), a result proved by Mitsuhiro Shishikura in 1991. A closely related fractal is the Julia set.

Escape-time fractals— (also known as "orbits" fractals) These are defined by a formula or recurrence relation at each point in a space (such as the complex plane). Examples of this type are the Mandelbrot set, Julia set, the Burning Ship fractal, the Nova fractal and the Lyapunov fractal. The 2d vector fields that are generated by one or two iterations of escape-time formulae also give rise to a fractal form when points (or pixel data) are passed through this field repeatedly.

Iterated function systems—These have a fixed geometric replacement rule. Cantor set, Sierpinski carpet, Sierpinski gasket, Peano curve, Koch snowflake, Harter-Highway dragon curve, T-Square, Menger sponge, are some examples of such fractals.

Random fractals—Generated by stochastic rather than deterministic processes, for example, trajectories of the Brownian motion, Levy flight, fractal landscapes and the Brownian tree. The latter yields so-called mass- or dendritic fractals, for example, diffusion-limited aggregation or reaction-limited aggregation clusters.

Strange attractors—Generated by iteration of a map or the solution of a system of initial-value differential equations that exhibit chaos.

Fractals can also be classified according to their self-similarity. There are three types of self-similarity found in fractals:

Exact self-similarity—This is the strongest type of self-similarity; the fractal appears identical at different scales. Fractals defined by iterated function systems often display exact self-similarity.

Quasi-self-similarity—This is a loose form of self-similarity; the fractal appears approximately (but not exactly) identical at different scales. Quasi-self-similar fractals contain small copies of the entire fractal in distorted and degenerate forms. Fractals defined by recurrence relations are usually quasi-self-similar but not exactly self-similar.

Statistical self-similarity—This is the weakest type of self-similarity; the fractal has numerical or statistical measures which are preserved across scales. Most reasonable definitions of "fractal" trivially imply some form of statistical self-similarity. (Fractal dimension itself is a numerical measure which is preserved across scales.) Random fractals are examples of fractals which are statistically self-similar, but neither exactly nor quasi-self-similar.

Approximate fractals are easily found in nature. These objects display self-similar structure over an extended, but finite, scale range. Examples include clouds, snow flakes, crystals, mountain ranges, lightning, river networks, cauliflower or broccoli, and systems of blood vessels and pulmonary vessels. Coastlines may be loosely considered fractal in nature.

Trees and ferns are fractal in nature and can be modeled on a computer by using a recursive algorithm. This recursive nature is obvious in these examples—a branch from a tree or a frond from a fern is a miniature replica of the whole: not identical, but similar in nature. The connection between fractals and leaves are currently being used to determine how much carbon is contained in trees. ("Hunting the Hidden Dimension." Nova. PBS. WPMB-Maryland. 28 Oct. 2008.)

In 1999, certain self similar fractal shapes were shown to have a property of "frequency invariance"—the same electromagnetic properties no matter what the frequency—from Maxwell's equations (see fractal antenna). (Hohlfeld R, Cohen N (1999). "Self-similarity and the geometric requirements for frequency independence in Antennae". Fractals. 7 (1): 79-84).

SUMMARY OF THE INVENTION

Most heat sinks are designed using a linear or exponential relationship of the heat transfer and dissipating elements. A known geometry which has not generally been employed is fractal geometry. Some fractals are random fractals, which are also termed chaotic or Brownian fractals and include random noise components. In deterministic fractal geometry, a self-similar structure results from the repetition of a design or motif (or "generator") using a recursive algorithm, on a series of different size scales. As a result, certain types of fractal images or structures appear to have self-similarity over a broad range of scales. On the other hand, no two ranges within the design are identical.

A fractal is defined as "a rough or fragmented geometric shape that can be split into parts, each of which is (at least approximately) a reduced-size copy of the whole." Mandelbrot, B. B. (1982). That is, there is a recursive algorithm which describes the structure. The Fractal Geometry of Nature. W.H. Freeman and Company. ISBN 0-7167-1186-9. This property is termed "self-similarity." For a more detailed discussion of fractals, see the Wikipedia article thereon at en.wikipedia·org/wiki/Fractal (last accessed Apr. 14, 2010) incorporated herein by reference. Exemplary images of well-known fractal designs can also be viewed on the Wikipedia page. Due to the fact that fractals involve largely self-repeating patterns, each of which serves to increase the surface area in three-dimensional fractals (perimeter in two-dimensional fractals), three dimensional fractals in theory are characterized by infinite surface area (and two-dimensional fractals are characterized by infinite perimeter). In practical implementations, the scale of the smallest features which remain true to the generating algorithm may be 3-25 iterations of the algorithm. Less than three recursions, and the fractal nature is not apparent, while present manufacturing technologies limit the manufacture of objects with a large range of feature scales.

This fractal nature is useful in a heat sink because the rate at which heat is transferred from a surface, either through convection or through radiation, is typically related to, and increasing with, the surface area. Of course, due to limitations in the technology used to build these heat sinks, engineering compromise is expected. However, a feature of an embodiment of the designs proposed herein is that vortices induced by fluid flow over a heat transfer surface will be chaotically distributed over various elements of the surface, thus disrupting the stagnant surface boundary layer and increasing the effective surface area available for heat transfer, while avoiding acoustic resonance which may be apparent from a regular array of structures which produce vortices and turbulence.

Further, a large physical surface area to volume ratio, which is generally useful in heat sink design, can still be obtained using the fractal model. In addition, fractal structures provide a plurality of concave regions or cavities, providing pockets of separated flow which can generate self-sustaining oscillations and acoustic resonance. These pockets serve to reduce the acoustic resonance in turbulent flowing fluid (as compared to flat or Euclidian surfaces), thus allowing for more effective heat transfer between the fractal structure and the surrounding fluid, thereby making the fractal structure ideal for a heat sink.

U.S. Pat. No. 7,256,751, issued to Cohen, incorporated herein by reference, discusses fractal antennas. In the background of this patent, Cohen discusses Kraus' research, noting that Euclidian antennas with low area (and therefore low perimeter) exhibit very low radiation resistance and are thus inefficient. Cohen notes that the advantages of fractal antennas, over traditional antennas with Euclidian geometries, is that they can maintain the small area, while having a larger perimeter, allowing for a higher radiation resistance. Also, Cohen's fractal antenna features non-harmonic resonance frequencies, good bandwidth, high efficiency, and an acceptable standing wave ratio.

In the instant invention, this same wave theory may be applied to fractal heat sinks, especially with respect to the interaction of the heat transfer fluid with the heat sink. Thus, while the heat conduction within a solid heat sink is typically not modeled as a wave (though modern thought applies phonon phenomena to graphene heat transport), the fluid surrounding the heating certainly is subject to wave phenomena, complex impedances, and indeed the chaotic nature of fluid eddies may interact with the chaotic surface configuration of the heat sink.

The efficiency of capturing electric waves in a fractal antenna, achieved by Cohen, in some cases can be translated into an efficiency transferring heat out of an object to be cooled in a fractal heat sink as described herein. See, Boris Yakobson, "Acoustic waves may cool microelectronics", Nano Letters, ACS (2010). Some physics scholars have suggested that heat can be modeled as a set of phonons. Convection and thermal radiation can therefore be modeled as the movement of phonons. A phonon is a quasiparticle characterized by the quantization of the modes of lattice vibration of solid crystal structures. Any vibration by a single phonon is in the normal mode of classical mechanics, meaning that the lattice oscillates in the same frequency. Any other arbitrary lattice vibration can be considered a superposition of these elementary vibrations. Under the phonon model, heat travels in waves, with a wavelength on the order of 1 μm. In most materials, the phonons are incoherent, and therefore at macroscopic scales, the wave nature of heat transport is not apparent or exploitable.

The thermodynamic properties of a solid are directly related to its phonon structure. The entire set of all possible phonons combine in what is known as the phonon density of states which determines the heat capacity of a crystal. At absolute zero temperature (0 Kelvin or −273 Celsius), a crystal lattice lies in its ground state, and contains no phonons. A lattice at a non-zero temperature has an energy that is not constant, but fluctuates randomly about some mean value. These energy fluctuations are caused by random lattice vibrations, which can be viewed as a gas-like structure of phonons or thermal phonons. However, unlike the atoms which make up an ordinary gas, thermal phonons can be created and destroyed by random energy fluctuations. In the language of statistical mechanics this means that the chemical potential for adding a phonon is zero. For a more detailed description of phonon theory, see the Wikipedia article thereon available at en.wikipedia·org/wiki/Phonon (last accessed Apr. 16, 2010) incorporated herein by reference.

In certain materials, such as graphene, phonon transport phenomena are apparent at macroscopic levels, which make phonon impedance measurable and useful. Thus, if a graphene sheet were formed to resonate at a particular phonon wavelength, the resonant energy would not be emitted. On the other hand, if the graphene sheet were configured using a fractal geometry, the phonon impedance would be well controlled over a broad range of wavelengths, with sharp resonances at none, leading to an efficient energy dissipation device.

Many fractal designs are characterized by concave regions or cavities. See, for example, FIGS. 2 and 3. While sets of concavities may be useful in improving aerodynamics and fluid dynamics to increase turbulence, if they are disposed in a regular array, they will likely produce an acoustic resonance, and may have peaks in a fluid impedance function. On the other hand, the multiscale nature of a fractal geometric design will allow the system to benefit from the concavities, while avoiding a narrowly tuned system.

The present system proposes a fractal-shaped heat sink for the purpose of dissipating heat. The benefits of a fractal heat sink, over a traditional heat sink having a Euclidian geometry may include: (1) the fractal heat sink has a greater surface area, allowing for more exposure of the hot device to the surrounding air or liquid and faster dissipation of heat; and (2) due to the plethora of concave structures or cavities in fractal structures, the fractal heat sink is better able to take advantage of flow mechanics than a traditional heat sink, resulting in heat entering and exiting the heat sink more quickly (3) acoustic properties, especially in forced convection systems.

The invention provides a heat sink to cool an object through convection or radiation. For the smallest heat sink elements, on the order of 10-100 nm, the focus of the heat transfer will be on radiation rather than convection. Electron emission and ionization may also be relevant. Larger heat sink elements, approximately >1 mm in size, will generally rely on convection as the primary form of heat transfer.

In one embodiment, the heat sink comprises a heat exchange device with a plurality of heat exchange elements having a fractal variation therebetween. A heat transfer fluid, such as air, water, or another gas or liquid, is induced to flow through the heat exchange device. The heat transfer fluid has turbulent portions. The fractal variation in the plurality of heat exchange elements substantially reduces the narrow band acoustic resonance as compared to a heat sink having a linear or Euclidian geometric variation between the plurality heat exchange elements. The turbulent flow also disturbs the stagnant surface boundary layer, leading to more efficient heat transfer.

When a heat transfer fluid (air, gas or liquid) is induced to flow over a surface, there may be turbulence in the fluid. The fractal shape of the heat sink serves to reduce the energy lost due to the turbulence, while increasing the surface area of the heat sink subject to turbulence, due to the plethora of concave regions, cavities, and pockets. Therefore, the efficiency of heat transfer may be increased as compared to a heat exchange device having a linear or Euclidian geometric variation between several heat exchange elements.

Preferably, the heat exchange device will include a highly conductive substance whose heat conductivity exceeds 850 W/(m*K). Examples of such superconductors include graphene, diamond, and diamond-like coatings. Alternatively, the heat exchange device may include carbon nanotubes.

Various variations on this heat sink will be apparent to skilled persons in the art. For example, the heat sink could include a heat transfer surface that is connected to the heat exchange device and is designed to accept a solid to be cooled. Alternatively, there could be a connector that is designed to connect with a solid to be cooled in at least one point. In another embodiment, there are at least three connectors serving to keep the solid and the heat sink in a fixed position relative to one another. Various connectors will be apparent to persons skilled in the art. For example, the connector could be a point connector, a bus, a wire, a planar connector or a three-dimensional connector. In another embodiment, the heat sink has an aperture or void in the center thereof designed to accept a solid to be cooled.

This heat sink is intended to be used to cool objects, and may be part of a passive or active system. Modern three-dimensional laser and liquid printers can create objects such as the heat sinks described herein with a resolution of features on the order of about 16 μm, making it feasible for those of skilled in the art to use such fabrication technologies to produce objects with a size below 10 cm. Alternatively, larger heat sinks, such as car radiators, can be manufactured in a traditional manner, designed with an architecture of elements having a fractal configuration. For example, a liquid-to-gas heat exchanger (radiator) may be provided in which segments of fluid flow conduit have a fractal relationship over three levels of recursion, i.e., paths with an average of at least two branches. Other fractal design concepts may be applied concurrently, as may be appropriate.

Yet another embodiment of the invention involves a method of cooling a solid by connecting the solid with a heat sink. The heat sink comprises a heat exchange device having a plurality of heat exchange elements having a fractal variation therebetween. A heat transfer fluid having turbulent portions is induced to flow with respect to the plurality of heat exchange elements. The fractal variation in the plurality of heat exchange elements serves to substantially reduce narrow band resonance as compared to a corresponding heat exchange device having a linear or Euclidean geometric variation between a plurality of heat exchange elements.

A preferred embodiment provides a surface of a solid heat sink, e.g., an internal or external surface, having fluid thermodynamical properties adapted to generate an asymmetric pattern of vortices over the surface over a range of fluid flow rates. For example, the range may comprise a range of natural convective fluid flow rates arising from use of the heat sink to cool a heat-emissive object. The range may also comprise a range of flow rates arising from a forced convective flow (e.g., a fan) over the heat sink.

The heat sink may cool an unconstrained or uncontained fluid, generally over an external surface of a heat sink, or a constrained or contained fluid, generally within an internal surface of a heat sink.

BRIEF DESCRIPTION OF THE DRAWINGS

FIG. 1 shows a set of governing equations for a parallel plate heat sink.

DETAILED DESCRIPTION OF THE PREFERRED EMBODIMENTS

Figure 1A:
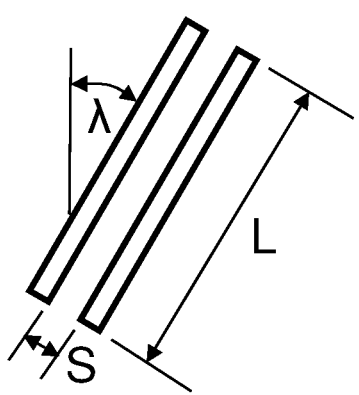
FIGS. 1A and 1B show the spatial relationships and dimensional labels for a parallel plate heat sink.
Figure 1B:
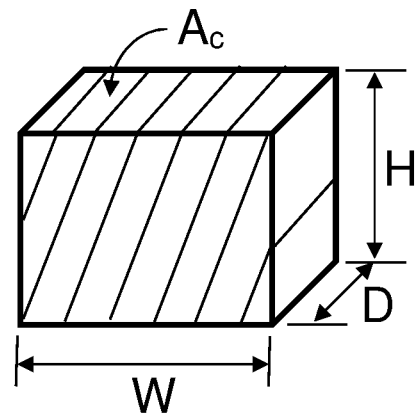
Figure 2:
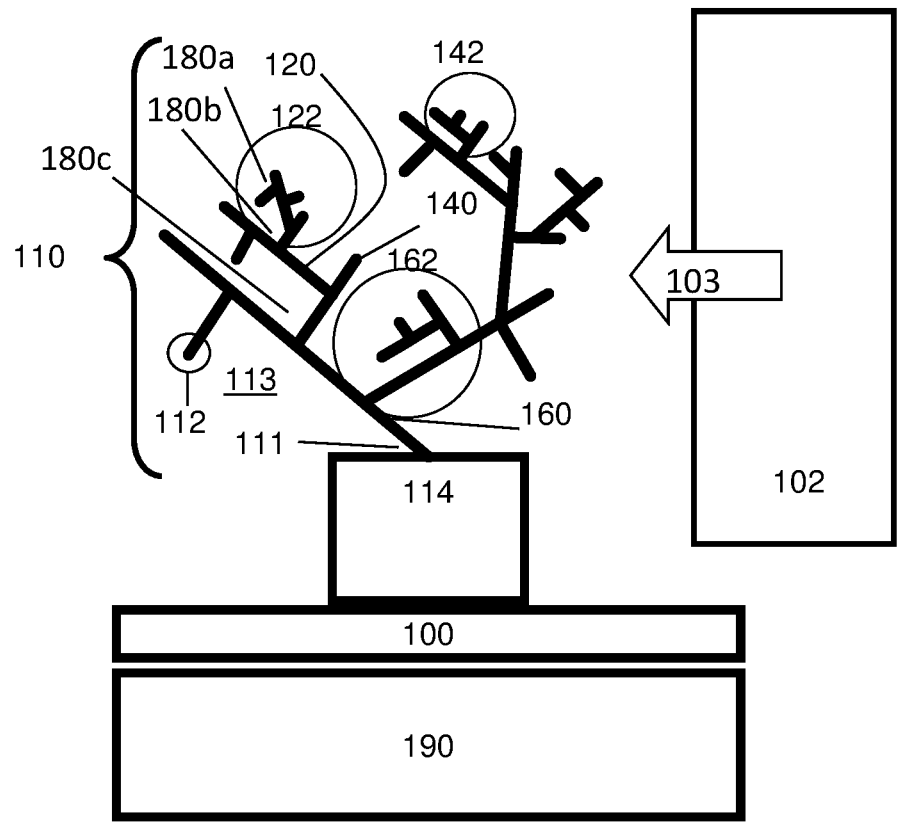

FIG. 2 illustrates a heat sink implementing an exemplary embodiment of this invention. Note that the illustration is in two dimensions, but a three-dimensional embodiment is both possible and preferred. There is a heat transfer surface 100 that allows the heat sink to rest comfortably on a surface, such as the solid to be cooled 190, through a connector 214. In the illustrated embodiment, the heat transfer surface 100 is roughly planar, having a closed Euclidian cross-section on the bottom. However, it might also have another shape, for example if the solid to be cooled does not have a planar face. A fractal-shaped heat exchange structure 110 begins at point 111. While only one fractal heat sink is illustrated here, skilled persons in the art will recognize other similar fractal heat sinks that are also intended to be covered by the invention. Note that the heat sink has three branches supported from point 111-branch 160, which supports branch 140, which in turn supports branch 120. Also note that the branch structure initiating from point 111 is nearly identical to that at point 122, 142, and 162 even though only point 111 is a true starting point. Thus, the fractal property of self-similarity is preserved. We call the structure that begins at point 111 the "first motif," the structure from point 162 the "second motif," and the structure that begins from point 142 the "third motif", and from point 122 the "fourth motif."

Note that, in the embodiment illustrated in FIG. 2, the replication from first to second motif and from second to third motif involves a linear displacement (upward) and a change of scale. In branches not going in the same direction as the prior branch, there is also a rotation. Under the limitations for ideal fractals, the second motif and third motif must be a smaller, exact copy of the first motif. However, due to the limitations imposed by human-made structures and machines, the fractals designed here are generally finite and the second motif will thus be an inexact copy of the first motif, i.e., if there are N levels starting from the first motif, the second motif level will have N−1 levels, if N is very large, the difference is insignificant. In other words, the self-similarity element required in fractals is not preserved perfectly in the preferred designs due to the limitations of available machinery. In addition, the benefits are achieved without requiring fractal relationships over more than a few "orders" of magnitude (iterations of the fractal recursive algorithm). For example, in the embodiment illustrated in FIG. 2, there are no continuing branch divisions and iterations at point 122, even though an ideal fractal would have them. In an ideal fractal, there would be an infinite number of sub-branches from points 111, 122, 142, and 162. However, an imperfect fractal shape, as illustrated in FIG. 2, will serve the purposes of this invention.

Persons of ordinary skill in the art will appreciate the advantages offered by the structure 110 in FIG. 2. The fractal heat sink has a much larger surface area than the heat transfer surface alone because all of the "branches" and "leaves" of the fern-like fractal shape serve to increase the surface area of their circumferential external surface boundary 112 with respect to a heat transfer fluid 113, such as by operation of a fan 102 which induces a flow 103 of surrounding gas. In addition, if a heat transfer fluid is induced to flow above the heat transfer surface 100, the turbulent portions of the heat transfer fluid near the surface will be increased by the textures inherent in the fractal variation in the heat exchange structure 110. Because the fractal pattern is itself non-identically repeating within the fractal design, this flow 103 of gas induced by fan 102 will serve to substantially reduce narrow band acoustic resonance as compared to a corresponding heat exchange device having a repeating design, e.g., a linear or geometric variation between several heat exchange elements, thereby further aiding in the heat transfer process.

In a preferred embodiment, the heat transfer surface 100 and the roughly fractal-shaped heat exchange structure 110 are all made out of an efficient heat conductor, such as copper or aluminum, or more preferably, having a portion whose heat conductivity exceeds 850 W/(m*K), such as graphene with a heat conductivity of between 4840 and 5300 W/(m*K) or diamond with a heat conductivity between 900 and 2320 W/(m*K). This would allow heat to quickly enter the heat sink from the solid and for heat to quickly exit the heat sink through the branches and leaves of the fern-like fractal-shaped heat exchange structure 110. In another embodiment, the heat sink is formed, at least in part, of carbon nanotubes, which display anisotropic heat conduction, with an efficient heat transfer along the long axis of the tube. Carbon nanotubes are submicroscopic hollow tubes made of a chicken-wire-like or lattice of carbon atoms. These tubes have a diameter of just a few nanometers and are highly heat conductive, transferring heat much faster than diamond, and in some cases comparable to graphene. See web.mit·edu/press/2010/thermopower-waves.html (last accessed Apr. 15, 2010) incorporated herein by reference.

Also note that this exemplary embodiment provides a plethora of openings between the branches or fractal sub-elements to ensure that all of the branches are exposed to the surrounding air, gas or liquid and to allow the heat to escape from the heat sink into the surroundings. In one embodiment of the invention, at least two of these openings are congruent. An embodiment of the invention allows the openings to be filled with the air or liquid from the surrounding medium. Due to the limitation imposed by the solid's flat shape, it is not possible to increase the exposure of the fern-like fractal to the solid. However, the air or liquid outside of the solid are perfect for the fractal's exposure.

Under the phonon model of heat exchange, applicable to carbon nanotubes, graphene materials, and perhaps others, the fractal shape is advantageous to ensure the escape of the phonons into the surrounding fluid medium because the fractal guarantees close to maximal surface exposure to the medium and does not have many parts that are not exposed, as is a problem with many prior art heat sinks. Skilled persons in the art will realize that this could be achieved through many known structures. For example, graphene, which is one-atom-thick carbon and highly heat conductive, would be an advantageous material to use to build the fractal heat sink herein described.

When a turbulently flowing fluid, such as the gas induced to flow 103 by the fan 102, passes around an obstacle, concave regions 180a, 180b, 180c, 280a, 280b, 280c or cavities in the obstacle create pockets of separated flow which generates self-sustaining oscillations and acoustic resonance. The concave regions 180a, 180b, 180c, 280a, 280b, 280c or cavities differ non-incrementally, and have substantially reduced narrow band acoustic resonance as compared to flat regions on the obstacle. This allows for more energy to be available for heat transfer. Skilled persons in the art will note that fractal structure 110 as shown in FIG. 2, as many other fractal structures, has a plurality of concave regions 180a, 180b, 180c, 280a, 280b, 280c to allow for an implementation of this effect.

Figure 3:
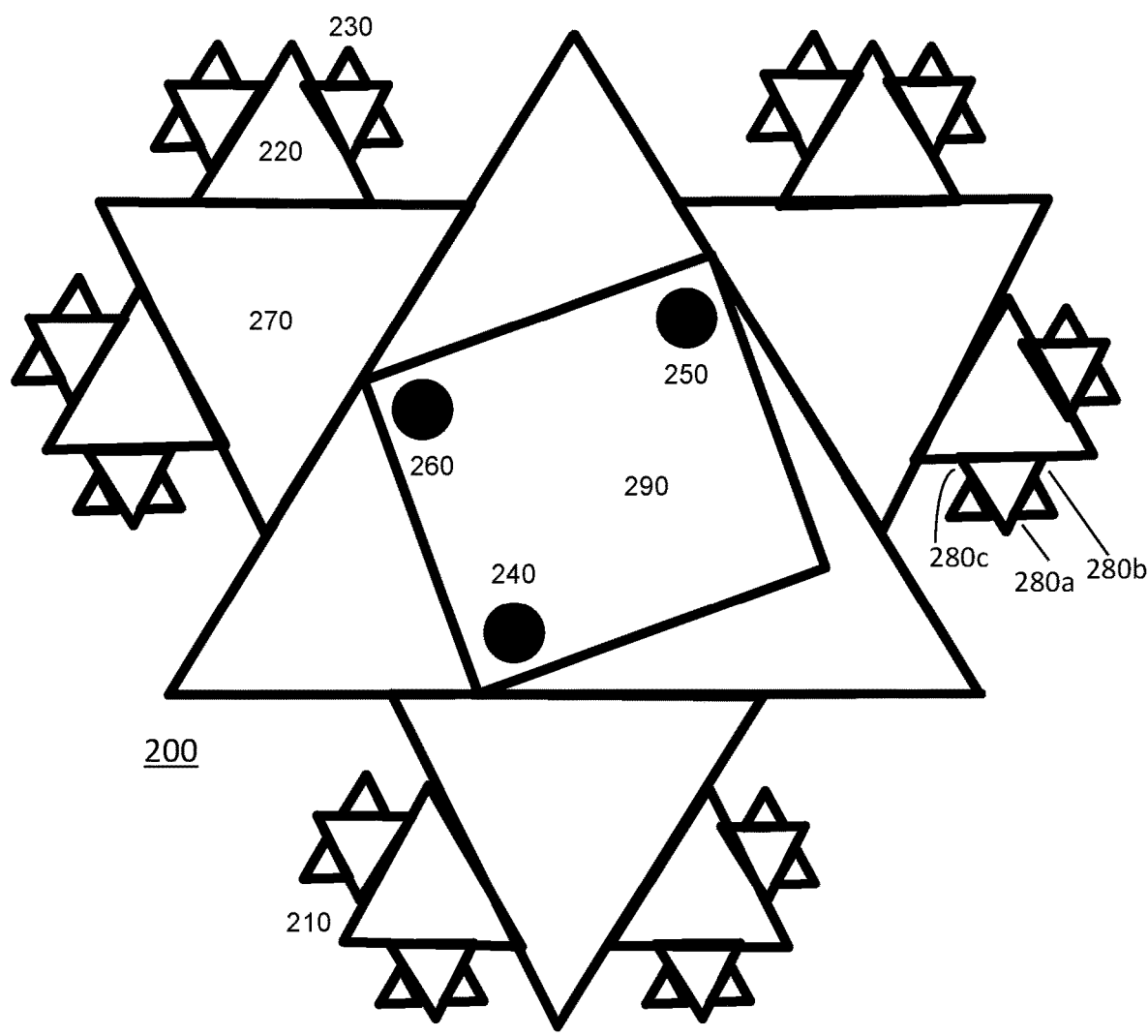
FIG. 3 illustrates a fractal heat sink that is an exemplary embodiment of the invention. In this embodiment, the heat sink is placed either adjacent to or surrounding the object to be cooled.

FIG. 3 illustrates another embodiment of the invention. A solid to be cooled that has an arbitrary shape 290 is located inside (illustrated) or outside (not illustrated) a two-dimensional or three-dimensional roughly fractal shaped 200 heat sink. In one embodiment, the heat sink 200 has an aperture 270 designed to hold the solid. Alternatively, the solid to be cooled might be located outside of the heat sink (not illustrated). Note that, as in FIG. 2, the fractal heat exchange element has multiple motifs, starting with the large triangle motif 210, to progressively smaller triangle motifs 220 and 230. However, note that the fractal does not keep extending infinitely and there are no triangles smaller than the one at motif 230. In other words, the fractal heat sink 200 has multiple recursive fractal iterations of motifs 220 and 230 of motif 210, but the fractal iterations stop at the level of motif 230 for simplicity of design and manufacturability. Also note that the fractal motifs 220 and 230 are of different dimensional sizes from the original fractal motif 210 and protrude from the original fractal motif 210. Here, the first motif is a large triangle, and the latter motifs are smaller triangles, which involve a rotation, linear displacement, and change of scale of the prior motif. In one embodiment, the fractal shape has some apertures in it (not illustrated) to allow the solid to be cooled to connect with other elements. Also, the solid to be cooled is connected to the fractal shape at point connector 240 and through bus wires at 250 and 260. The solid should be connected to the fractal heat sink in at least one point, either through a point connection, a bus wire connection, or some other connection. If it is desired that the solid be fixed inside the heat sink, there may be at least three connection points, as illustrated. However, only one connection point is necessary for heat convection and radiation from the solid to the heat sink. Preferably, the point or bus wire connection is built using a strong heat conductor, such as carbon nanotubes or a diamond-like coating.

Note that, as in FIG. 2, the fractal structure 200 in FIG. 3 has multiple concave regions 280a, 280b, 280c or cavities. When a turbulently flowing fluid passes around this fractal heat sink, the concave regions 280a, 280b, 280c or cavities substantially reduce the narrow band acoustic resonance as compared to a flat or Euclidian structure. This allows for more energy to be available to for heat transfer.

In yet another embodiment of the invention, the heat sink 200 in FIG. 3 could be constructed without the connections at points 240, 250, and 260. In one embodiment, a liquid or gas would fill the aperture 270 with the intent that the liquid or gas surround the solid to be cooled, hold it in place, or suspend it. Preferably, the liquid or gas surrounding the solid would conduct heat from the solid to the heat sink, which would then cause the heat to exit.

Those skilled in the art will recognize many ways to fabricate the heat sinks described herein. For example, modern three-dimensional laser and liquid printers can create objects such as the heat sinks described herein with a resolution of features on the order of 16 μm. Also, it is possible to grow a crystal structure using a recursive growth algorithm or through crystal growth techniques. For example, US Patent Application No. 2006/0037177 by Blum, incorporated herein by reference, describes a method of controlling crystal growth to produce fractals or other structures through the use of spectral energy patterns by adjusting the temperature, pressure, and electromagnetic energy to which the crystal is exposed. This method might be used to fabricate the heat sinks described herein. For larger heat sinks, such as those intended to be used in car radiators, traditional manufacturing methods for large equipment can be adapted to create the fractal structures described herein.

In this disclosure, we have described several embodiments of this broad invention. Persons skilled in the art will definitely have other ideas as to how the teachings of this specification can be used. It is not our intent to limit this broad invention to the embodiments described in the specification. Rather, the invention is limited by the following claims.

What is claimed is:

1. A method of cooling a heat transfer surface, comprising:
    providing a heat sink comprising:
        a plurality of heat exchange elements arranged in a fractal branching pattern over at least three levels of branching,
        each heat exchange element having an external surface of a respective branch configured to transfer heat derived from the heat transfer surface to a surrounding flowable heat exchange medium; and
    flowing the flowable heat exchange medium relative to the external surfaces of the plurality of heat exchange elements, such that the flow of the flowable heat exchange medium successively encounters at least two branch points of different branches,
    to thereby transfer heat between the heat transfer surface and the heat sink, and between the heat sink and the flowable heat exchange medium,
    wherein the flowable heat exchange medium has a different temperature than the solid composition; and
    wherein the flowable heat transfer medium interacts with the fractal branching pattern to induce a broadband acoustic emission.

2. The method according to claim 1, wherein the fractal branching pattern defines a central void space, and the flowable heat transfer medium comprises air, which is induced to flow by a fan.

3. The method according to claim 1, wherein the external surfaces of the plurality of heat exchange elements define a plurality of concave regions.

4. The method according to claim 3, wherein the plurality of concave regions differ by non-uniform increments.

5. The method according to claim 3, wherein the plurality of concave regions interact with the flow of the flowable heat exchange medium without producing narrow band acoustic resonance.

6. The method according to claim 3, wherein the plurality of concave regions interact with the flow of the flowable heat exchange medium to create pockets of separated flow which generate self-sustaining oscillations.

7. The method according to claim 1, wherein the flowable heat transfer medium is induced to flow turbulently with respect to the external surfaces.

8. The method according to claim 1, wherein the plurality of heat exchange elements branch in two dimensions.

9. The method according to claim 1, wherein the plurality of heat exchange elements branch in three dimensions.

10. The method according to claim 1, wherein the flow of the flowable heat exchange medium relative to the external surfaces of the plurality of heat exchange elements, such that the flow of the flowable heat exchange medium successively encounters at least two branch points of different branches, produces an acoustic emission having acoustic power distributed over a wide band.

11. The method according to claim 1, further comprising receiving heat from an electronic device through the heat transfer surface.

12. The method according to claim 1, further comprising inducing the flow of the flowable heat transfer medium with a fan.

13. The method according to claim 1, further comprising actively inducing flow of a liquid heat transfer medium through an internal microchannel within the plurality of heat exchange elements, concurrent with actively inducing flow of the flowable heat exchange medium over the external surfaces of the plurality of heat exchange elements.

14. A heat exchange method, comprising:
    providing a heat exchanger comprising a branched pattern of heat exchange elements in a multiscale fractal geometric design having at least three levels of branching, defining a plurality of concave regions configured for turbulent interaction with a flowing heat exchange medium; and actively inducing a flow of the heat exchange medium over at least two successive branches of the at least three levels of branching of the heat exchanger, to cause the turbulent interaction with the plurality of concave regions and associated acoustic emissions, the turbulent interaction causing a broadband acoustic emission having an acoustic spread across an acoustic frequency spectrum having a plurality of peaks selectively defined by a configuration of the multiscale fractal geometric design having the at least three levels of branching.

15. A heat sink method, comprising:

defining a plurality of concave regions of a heat exchanger comprising a branched pattern of heat exchange elements in a multiscale fractal geometric design, having at least three successive level of branches, the plurality of concave regions being configured to interact with a flowing heat exchange medium to produce turbulent flow; and inducing the turbulent flow of the heat exchange medium with a fan to disturb a surface boundary layer on the heat exchange elements and generate broadband acoustic frequency emission having a spread acoustic spectrum selectively dependent on the plurality of concave regions and the multiscale fractal geometric design.

16. The heat sink method according to claim 15, wherein the turbulent flow of the heat exchange medium generates flow-induced vortices at locations of respective ones of the plurality of heat exchange elements defined by the multiscale fractal geometric design, resulting in a multipeak spread acoustic spectrum.

17. The method according to claim 14, wherein the plurality of concave regions differ in geometric location according to non-uniform increments.

18. The method according to claim 14, wherein the plurality of concave regions interact with the actively induced flow of the heat exchange medium to create pockets of separated flow which generate self-sustaining oscillations.

19. The method according to claim 14, wherein the branched pattern of heat exchange elements branch in three dimensions.

20. The method according to claim 14, wherein the actively induced flow of the heat exchange medium over the heat exchanger causes portions of the heat exchange medium to successively encounter at least two branch points of the branched pattern, in different branches of the branched pattern.

* * * * *